US012154757B2

(12) United States Patent
Graham

(10) Patent No.: US 12,154,757 B2
(45) Date of Patent: Nov. 26, 2024

(54) AUTOMATED ION-BEAM ALIGNMENT FOR DUAL-BEAM INSTRUMENT

(71) Applicant: FEI COMPANY, Hillsboro, OR (US)

(72) Inventor: Jeremy Graham, Hillsboro, OR (US)

(73) Assignee: FEI COMPANY, Hillsboro, OR (US)

( * ) Notice: Subject to any disclaimer, the term of this patent is extended or adjusted under 35 U.S.C. 154(b) by 367 days.

(21) Appl. No.: 17/750,569

(22) Filed: May 23, 2022

(65) Prior Publication Data
US 2023/0377830 A1    Nov. 23, 2023

(51) Int. Cl.
*H01J 37/304* (2006.01)
*H01J 37/141* (2006.01)
*H01J 37/147* (2006.01)
*H01J 37/21* (2006.01)
*H01J 37/26* (2006.01)
*H01J 37/28* (2006.01)
*H01J 37/05* (2006.01)

(52) U.S. Cl.
CPC ........ *H01J 37/1471* (2013.01); *H01J 37/141* (2013.01); *H01J 37/21* (2013.01); *H01J 37/265* (2013.01); *H01J 37/28* (2013.01); *H01J 37/304* (2013.01); *H01J 37/05* (2013.01); *H01J 2237/0825* (2013.01); *H01J 2237/1501* (2013.01); *H01J 2237/223* (2013.01); *H01J 2237/28* (2013.01); *H01J 2237/304* (2013.01); *H01J 2237/31749* (2013.01)

(58) Field of Classification Search
None
See application file for complete search history.

(56) References Cited

U.S. PATENT DOCUMENTS

| 10,763,079 | B1 | 9/2020 | Graham et al. | |
| 2008/0023641 | A1* | 1/2008 | Takeuchi | H01J 37/09 250/396 ML |
| 2010/0301211 | A1* | 12/2010 | Miller | H01J 37/09 250/307 |

* cited by examiner

Primary Examiner — Eliza W Osenbaugh-Stewart
(74) Attorney, Agent, or Firm — Michael Best & Friedrich LLP

(57) ABSTRACT

Disclosed herein are scientific instrument support systems, as well as related methods, apparatus, computing devices, and computer-readable media. For example, some embodiments provide a scientific instrument comprising an ion-beam instrument configured to generate an ion beam including first and second sub-beams; an electron-beam instrument including a charged-particle-beam (CPB) lens having an adjustable setting controlling a magnetic force applied to the first and second sub-beams; and a computing device. The computing device is configured to: acquire an image by causing the ion-beam instrument to scan the ion beam across a sample using a selected setting of the CPB lens of the electron-beam instrument, apply automated image processing to the image to quantify an amount of spatial misalignment of the first and second sub-beams at the sample, and control the CPB lens of the electron-beam instrument to a setting based on the amount of spatial misalignment within the image.

20 Claims, 9 Drawing Sheets

AUTOMATED ION-BEAM ALIGNMENT FOR DUAL-BEAM INSTRUMENT

FIELD

Scientific instruments, such as, for example, microscopes and other imaging instruments, may include a complex arrangement of movable components, sensors, input and output ports, energy sources, and consumable components. When this complex arrangement is not in a proper configuration, the instrument may not be able to perform its intended function.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
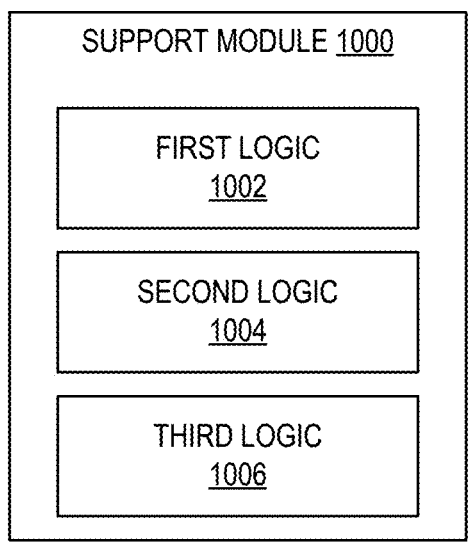
FIG. 1 is a block diagram of an example scientific instrument support module for performing support operations, in accordance with various embodiments.

Disclosed herein are scientific instrument support systems, as well as related methods, apparatus, computing devices, and computer-readable media. For example, according to one embodiment, a support apparatus is provided for dual-beam instrument, wherein an ion-beam instrument of the dual-beam instrument is configured to generate an ion beam, the ion beam including first and second sub-beams having ions of different respective mass-to-charge ratios. An electron-beam instrument included in the dual-beam instrument includes a charged-particle-beam (CPB) lens having an adjustable setting controlling a magnetic force applied to the first and second sub-beams. The support apparatus, which may be implemented by a common computing device included in the dual-beam instrument or remote from the dual-beam instrument or implemented by a plurality of computing devices included in the dual-beam instrument, remote from the dual-beam instrument, or a combination thereof, is configured to acquire a plurality of images by causing the ion-beam instrument to scan the ion beam across a sample, each of the plurality of images corresponding to a different respective setting of the CPB lens of the electron-beam instrument, apply automated image processing to the plurality of images to quantify an amount of spatial misalignment of the first and second sub-beams at the sample represented within each of the plurality of images, and control the CPB lens of the electron-beam instrument to a setting based on the amount of spatial misalignment within each of the plurality of images. An automated method performed via a computing device for providing such scientific instrument support is also provided.

The scientific instrument support embodiments disclosed herein may achieve improved performance relative to conventional approaches and, in particular, may achieve improved performance of dual-beam instruments. Dual-beam instruments may include an ion-beam instrument, such as, for example, a focused ion beam (FIB) instrument or, in particular, a plasma focused ion-beam (PFIB) instrument, and an electron-beam instrument, such as, for example, a scanning electron microscope (SEM) instrument. The electron-beam instrument included in a dual-beam instrument uses an electron beam, whereas the ion-beam instrument included in the dual-beam instrument uses an ion beam.

Dual-beam instruments may be used to perform, among other things, imaging, analysis, deposition, ablation, or a combination thereof. For example, dual-beam instruments may be used for transmission electronic microscopy (TEM) sample preparation, subsurface and three-dimensional (3D) characterization, nano-prototyping, and in situ experimentation. The combination of an electron-beam instrument and an ion-beam instrument within the dual-beam instrument may provide benefits, such as, for example, the ability to use the different imaging methods provided by the two instruments synergistically or in a complementary manner.

In a dual-beam instrument, the ion-beam instrument may be used independently from the electron-beam instrument. In this configuration, magnetic fields from one or more charged-particle-beam (CPB) lenses of the electron-beam instrument (e.g., an ultra high resolution (UHR) lens, which is sometimes also referred to as an immersion lens) may cause splitting of the atomic and molecular beam components generated via the ion-beam instrument. In some cases, the CPB lens causing the splitting can be the "last" lens along the propagation path of the electron beam in the electron-beam instrument. Other (in terms of location or function) CPB lenses may also cause some degree of splitting. In some cases, the splitting may occur even when a corresponding CPB lens in the electron-beam instrument is in an "OFF" mode, wherein a small current (e.g., −10 to −20 ampere-turns (AT)) runs through the CPB lens in this mode. The impact of such magnetic fields may vary based on operating conditions of the ion-beam instrument, a sample being processed by the dual-beam instrument, or a combination thereof. For example, a PFIB instrument may use different ion species including, for example, xenon (Xe), argon (Ar), nitrogen (N2), and oxygen (O2), and magnetic fields from a CPB lens in the electron-beam instrument may impact these ion species differently. Gas switching also implies a temporary mix of ion masses, which may also be affected by the magnetic fields associated with CPB lenses in the electron-beam instrument in various ways. For example, residual xenon contamination in an argon beam may be affected by magnetic fields associated with CPB lenses in the electron-beam instrument differently from how such fields impact atomic and molecular beams in oxygen or nitrogen beams. Furthermore, a sample being processed with the dual-beam instrument may have magnetic properties, which may also impact an ion beam.

Ion beam splitting caused by one or more CPB lenses in the electron-beam instrument may lead to two separate probes at a sample. Accordingly, when multi-component beams experience splitting, performance of the dual-beam instrument may suffer. Some dual-beam instruments may include an alignment mechanism, often referred to as a "double spot compensation" alignment mechanism, that allows a user to control a CPB lens of the electron-beam instrument when the electron-beam instrument is in an "OFF" mode, but this mechanism is controlled manually by visual assessment of an operator.

Embodiments described herein provide automated ion-beam alignment for a dual-beam instrument by applying one or more automated image analysis techniques to at least one image acquired using a dual-beam instrument to quantify beam splitting (i.e., beam misalignment). The quantified amount of beam splitting is used to determine an optimized setting of at least one CPB lens included in an electron-beam instrument, and the dual-beam instrument is automatically controlled (i.e., controlled in response to determining the optimized setting performed via one or more computing devices and without requiring intermediate manual operation or input) to set the at least one CPB lens to the determined optimized setting. Using image analysis techniques to automate the determination and setting of the CPB lens improves user experience and results, such, as for example, improvements in terms of reducing set-up or configuration time of the dual-beam instrument and accuracy of functionality performed via the dual-beam instrument.

The automated ion-beam alignment for a dual-beam instrument may be implemented via the dual-beam instrument (e.g., one or more computing devices included as part of the dual-beam instrument), a common computing device remote from the dual-beam instrument, via a plurality of computing devices remote from the dual-beam instrument, or a combination thereof (e.g., implemented via functionality provided by one or more computing devices included as part of the dual-beam instrument and one or more computing devices remote from the dual-beam instrument).

The dual-beam instrument may include, among other components, an ion-beam instrument (also sometimes referred to as an ion-beam column), an electron-beam instrument (also sometimes referred to as an electron-beam column, such as, for example, a scanning-electron-microscope (SEM) column), one or more CPB lenses in either or both of the columns, and one or more suitable detectors to measure emission from a sample, which may be a reference sample (i.e., a sample used for configuration purposes separate from a sample subsequently processed via the dual-beam instrument). The ion-beam column may include a plasma source connected to a supply of a diatomic gas. The plasma source may cause a first sub-beam of the ion beam to carry a monoatomic ion species of the diatomic gas and may further cause a second sub-beam of the ion beam to carry a diatomic ion species of the diatomic gas. The ion-beam column may include ion-beam optics used to focus the ion beam at the sample.

The at least one acquired image may be one or more images, such as, for example, one or more secondary electron (SE) images (e.g., acquired via one or more secondary electron detectors (SEDs) included in the dual-beam instrument). Other types of imaging may be performed as part of the image acquisition depending on the type of detectors available, such as, for example, secondary ion imaging. The acquired one or more images may include sample images corresponding to each sub-beam. In some embodiments, the acquired one or more images include a plurality of images, wherein each image of the plurality of images is acquired using at least one static setting of the ion-beam instrument and at least one different setting of the electron-beam instrument, such as, for example, a different setting of at least one CPB lens of the electron-beam instrument (e.g., an excitation current of the CPB).

The automated image processing may include detecting a feature, such as an image artifact (e.g., a ghost or double image), within one or more of the acquired images representing a spatial misalignment of the sub-beams, wherein this detected feature is used to set an optimized setting of at least one CPB lens of the electron-beam instrument (e.g., an excitation current of the CPB). In some embodiments, the optimized setting is based on a quantified measurement of the spatial misalignment detected within one or more of the acquired images, wherein the quantified measurement may represent a degree of misalignment, a correction amount that, if applied to an acquired image, would reduce an amount of spatial misalignment represented within the image, or the like, and this degree of misalignment may be compared to one or more thresholds or processed in various ways to determine an optimized setting for the CBP lens of the electron-beam instrument. For example, the image processing may include one or more of: (i) detecting one or more image artifacts, such as ghost images, in one or more of the acquired images, the one or more image artifacts being caused by spatial misalignment of the first and second sub-beams at the sample; (ii) determining parameters for de-ghosting the one or more of the images and quantifying the spatial misalignment of the first and second sub-beams at the sample based on the de-ghosting parameters; (iii) quantifying the spatial misalignment of the first and second sub-beams at the sample based on determining a correction action needed to digitally remove the one or more artifacts from the one or more of the images; (iv) applying a Fourier-transform operation to one or more of the images; (v) generating one or more binary Fourier-transform maps by applying a thresholding operation to a result of the Fourier-transform operation; and (vi) quantifying spatial misalignment of the first and second sub-beams at the sample based on the one or more binary Fourier-transform maps. In some embodiments, the quantified measurement of misalignment detected in one or more of the acquired images is used to select one of the acquired images representing an optimized (e.g., minimized) amount of spatial misalignment, wherein the CPB lens setting of the electron-beam instrument associated with the selected image is used to set the optimized setting of this lens (e.g., set the lens to the setting associated with the selected image or a setting determined based on the setting associated with the selected image, such as, for example, the setting associated with the selected image plus or minus a predetermined or variable amount). In other embodiments, the quantified measurement of spatial alignment associated with one acquired image is used to set the CPB lens setting such that a single image is selected from a set of images. For example, one or more formulas, models, or look-up tables may be used to determine an optimized setting using the quantified spatial misalignment measured in one or more acquired images. Also, in some embodiments, the quantified spatial misalignment measured in on or more images may be used to obtain or calculate an optimized lens setting, such as, for example, taking an average, a median, a minimum, a maximum, interpolating, extrapolating, or the like of the quantified measurements, the CPB lens settings (excitation currents) associated with the acquired images, or a combination thereof. For example, in these embodiments, the optimized lens setting may not correspond to the CPB lens setting associated with one acquired image but may lie in between the CPB lens settings of two acquired images.

Regardless of how the image processing is used to determine an optimized setting, the dual-beam instrument is controlled to set the CPB lens of the electron-beam instrument to the determined optimized setting. This control may be performed by controlling an amount of excitation current applied to the CPB lens, which may be performed via one or more mechanical, electrical, or software-based functions. In some embodiments, rather than automatically controlling the instrument, the control may be performed by automatically instructing an operator to set to CPB lens to the determined optimized setting (e.g., through one or more user interfaces or output mechanisms).

Some embodiments provide an automated method of tuning an imaging apparatus having some or all of the aforementioned features. The method, or portions thereof, can be executed in response to one or more trigger conditions being present. Example trigger conditions may include but are not limited to: (i) the ion-beam instrument of the dual-beam instrument being used independently of the electron-beam instrument, (ii) the ion-beam instrument using a particular mixture of gases, (iii) the ion-beam instrument switching between gases (wherein residual gases may exist), (vi) operation of the dual-beam instrument with the electron-beam instrument in an "OFF" or "near-zero" operating mode, or a combination or particular sequence thereof. In some embodiments, a human operator of the instrument may manually trigger (i.e., create a triggering condition) execution of the method. Also, in some embodiments, the determined optimized setting may be used to create a look-up table, model, or other mechanism that may be used during subsequent operation of the dual-beam instrument as a reference to (i) perform an initial configuration check of the instrument, (ii) perform the tuning method described herein, such as, for example, determining a default or set of CPB lens settings to use during the image acquisition, (iii) automatically control the dual-instrument without performing the image acquisition and image processing of the automatic tuning method. Regardless of whether such a reference mechanism is created or maintained, the automatic tuning method or portions thereof may be performed each time the dual-beam instrument is operated (e.g., and one or more triggering conditions are satisfied), when the dual-beam instrument is operated in predetermined environments (e.g., predetermined types of samples) or using predetermined operational settings, at a predetermined frequency or according to a predetermined schedule, when a default lens setting is associated with an amount of spatial misalignment satisfying a predetermined threshold, or a combination thereof.

Accordingly, embodiments disclosed herein provide improvements to scientific instrument technology (e.g., improvements in the computer technology supporting such scientific instruments, among other improvements). For example, embodiments disclosed herein may achieve improved accuracy and operation of a dual-beam instrument (e.g., improved imaging and characterization, improved sample preparation, improved nano-prototyping, and improved experimentation) relative to conventional approaches. Conventional approaches rely on a user to visually identify beam splitting and manually adjust a CPB lens accordingly. This approach, however, suffers from a number of technical problems and limitations, including inaccurate operation settings for the dual-beam instrument, which may result in inaccurate operation and inefficient use of the dual-beam instrument and associated resources, such as when an operation performed via the dual-beam instrument must be repeated to acquire more accurate results. Also, given the impact of ion beams on samples, repeating an operation to acquire more accurate results may be detrimental to the sample or create unintended variances in the sample between operations.

Various ones of the embodiments disclosed herein may improve upon conventional approaches to achieve the technical advantages of improved accuracy of operations performed via an ion-beam instrument and reduction in setup time by automatically determining an optimized setting of a CPB lens of an electron-beam instrument and automatically, based on the determined optimized setting, setting or configuring the CPB lens accordingly. Such technical advantages may not be achievable by routine and conventional approaches, and all users of systems including such embodiments may benefit from these advantages (e.g., by assisting the user in the performance of a technical task, such as configuring the CPB lens to reduce or minimize beam splitting during operation of the ion-beam instrument). The technical features of the embodiments disclosed herein are thus decidedly unconventional in the field of ion-beam imaging via a dual-beam instrument, as are the combinations of the features of the embodiments disclosed herein. As discussed further herein, various aspects of the embodiments disclosed herein may improve the functionality of a computer itself; for example, by operating the dual-beam instrument in an optimized manner resulting in more accurate results. The computational features disclosed herein do not only involve the collection and comparison of information but apply new analytical and technical techniques to change the operation of the dual-beam instrument. The present disclosure thus introduces functionality that neither a conventional computing device, nor a human, could perform.

Accordingly, embodiments of the present disclosure may serve any of a number of technical purposes, such as controlling a specific technical system or process; determining from measurements how to control a machine; or digital audio, image, or video enhancement or analysis. In particular, the present disclosure provides technical solutions to technical problems, including but not limited to applying one or more image analysis techniques to an image acquired via an ion-beam instrument included in a dual-beam instrument to automatically determine an optimized setting for a CPB lens of an electron-beam instrument included in the dual-beam instrument to reduce or minimize beam splitting and automatically control the CPB lens based on the determined optimized setting.

Example embodiments disclosed herein thus provide improvements to ion-beam imaging technology associated with dual-beam instruments (e.g., improvements in the computer technology supporting imaging technology, among other improvements).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

FIG. 1 is a block diagram of a scientific instrument support module 1000 for performing support operations, in accordance with various embodiments. The scientific instrument support module 1000 may be implemented by circuitry (e.g., including electrical and/or optical components), such as a programmed computing device. The logic of the scientific instrument support module 1000 may be included in a single, common computing device or may be distributed across multiple computing devices that are in communication with each other as appropriate. Examples of computing devices that may, singly or in combination, implement the scientific instrument support module 1000 are discussed herein with reference to the computing device 7000 of FIG. 7, and examples of systems of interconnected computing devices, in which the scientific instrument support module 1000 may be implemented across one or more of the computing devices, is discussed herein with reference to the scientific instrument support system 8000 of FIG. 8.

As illustrated in FIG. 1, the scientific instrument support module 1000 may include first logic 1002, second logic 1004, and third logic 1006 for performing support methods as described herein for a scientific instrument, such as, for example, a dual-beam instrument. As noted above, a dual-beam instrument may include an ion-beam instrument (e.g., a focused ion-beam (FIB) instrument) and an electron-beam instrument (e.g., a scanning electron microscope (SEM) instrument). As used herein, the term "logic" may include an apparatus that is to perform a set of operations associated with the logic. For example, any of the logic elements included in the scientific instrument support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module.

The first logic 1002 may acquire one or more images of a sample via the ion-beam instrument of the dual-beam instrument. As described in more detail below with respect to the dual-beam instrument 9000 of FIG. 9, to perform such imaging, an ion beam, generated via the ion-beam instrument, is scanned across the sample and emission from the sample produced in response to the ion beam is detected via one or more detectors of the dual-beam instrument. Specific types of the detectors employed in the instrument 9000 depend on the specific embodiment(s) thereof and can typically be chosen from a variety of detector types suitable for detecting different types of emission and/or radiation from the sample in response to an electron beam and/or an ion beam. An example list of the types of emission/radiation that can be generated in this manner includes, but is not limited to X-rays, infrared light, visible light, ultraviolet light, secondary electrons, and backscattered electrons. Various detector types may be selected for the instrument 9000 to detect the pertinent types of emission/radiation. The ion beam generated via the ion-beam instrument includes first and second sub-beams having ions of different respective mass-to-charge ratios. As noted above, magnetic fields generated via a CPB lens (for example, an ultra high resolution (UHR) lens) of the electron-beam instrument included in the dual-beam instrument may affect the ion-beam generated by the ion-beam instrument even when the electron-beam instrument is in an "OFF" or "near-zero" operating mode. Accordingly, in some embodiments, the first logic 1002 may acquire images via the ion-beam instrument at one or more settings of the CPB lens of the electron-beam instrument, such as, for example, at one or more different ampere-turn (AT) settings of the CPB lens. In other words, in some embodiments, the first logic 1002 acquires one or more images generated using the ion beam, wherein each acquired image is associated with a different setting (e.g., a different AT setting) of the CPB lens of the electron-beam instrument. The first logic 1002 may associate each image with a particular CPB lens setting through metadata or header information stored with an image or separate from an image.

In some embodiments, the first logic 1002 also initially determines whether a support method as described herein is needed. For example, in some embodiments, the support method described herein is triggered in response to one or more triggering conditions being satisfied. The one or more triggering conditions may include the ion-beam instrument of the dual-beam instrument being used independently of the electron-beam instrument, the ion-beam instrument using a particular mixture of gases, the ion-beam instrument switching between gases (wherein residual gases may exist), or a combination thereof. In other words, the one or more trigger conditions may represent operating conditions of the dual-beam instrument where ion beam splitting may occur and, thus, automated control of the CPB lens of the electron-beam instrument may result in improved operation of the dual-beam instrument.

The second logic 1004 may apply automated image processing to the one or more images acquired via the first logic 1002 to quantify an amount of spatial misalignment of the first and second sub-beams at the sample represented within an image, wherein the spatial misalignment may be caused by beam splitting as described above. In some embodiments, the automated image processing detects the presence of an image artifact within an image and quantifies the severity of the image artifact. For example, spatial misalignment of sub-beams of an ion beam may cause a ghost or double image artifact within an image acquired via the first logic 1002. Accordingly, the second logic 1004 may apply one or more image processing techniques to detect such a ghost or double image and quantify the artifact. In some embodiments, as described in more detail below with respect to FIGS. 3, 4, 5, and 6A-6B, the automated image processing includes generating a binary Fourier-transform map of an acquired image to quantify an amount of ion-beam misalignment represented within the image. However, other image processing techniques configured to detect a ghost or double image artifacts may be used in other embodiments.

The third logic 1006 may select an image acquired and processed via the first and second logic 1002 and 1004, respectively, wherein the setting of the CPB lens of the electron-beam instrument associated with the selected image (i.e., the setting the CPB lens was operating at when the selected image was acquired) represents an optimized setting of the CPB lens. Accordingly, based on the identified optimized setting, the third logic 1006 may control the dual-beam instrument to automatically set the CPB lens of the electron-beam instrument to a setting (e.g., an AT setting) based on the determined optimized setting. The third logic 1006 may apply one or more thresholds or comparisons to select an image representing an optimized CPB lens setting. For example, in some embodiments, the third logic 1006 compares a quantified amount of spatial misalignment represented within an image (as determined via the second logic 1004) to a threshold. In response to the quantified amount of spatial misalignment satisfying the threshold, the third logic 1006 may control the dual-beam instrument to set the CPB lens of the electron-beam instrument to a setting based on the CPB lens setting associated with the selected image. Alternatively, or in addition, the third logic 1006 may compare quantified amounts of spatial misalignment represented within each of a plurality of images and select one of the plurality of images having a minimum quantified amount of spatial misalignment. To control the dual-beam instrument and set the CPB lens to a setting, the third logic 1006 may send one or more control signals to the CPB lens or another component of the dual-beam instrument configured to control the CPB lens, may automatically control a "double spot compensation" alignment mechanism of the dual-beam instrument, or a combination thereof.

In some embodiments, the second logic 1004, the third logic 1006, other logic (e.g., fourth logic) included in the scientific instrument support module 1000, or a combination thereof also stores the determined setting of the CPB lens to allow the optimized setting to be used for future operation of the dual-beam instrument. For example, in some embodiments, a look-up table or similar data structure is created and maintained that stores optimized settings of the CPB lens of the electron-beam instrument for different operating conditions of the dual-beam instrument, such as, for example, different ion species used by the ion-beam instrument, different ion-beam instrument energy levels, or a combination thereof. The look-up table or similar data structure allows the results of the support method as described herein to be reused for future operation of the dual-beam instrument without, in some embodiments, needing to re-perform the method. In other embodiments, in addition to or as an alternative to creating a look-up table or similar data structure, the scientific support method described herein as being performed by the scientific instrument support module 1000 may be performed in-situ, which allows the support method to react to the specific operating conditions and environment of the dual-beam instrument, including, for example, the specific sample being imaged.

Figure 2:
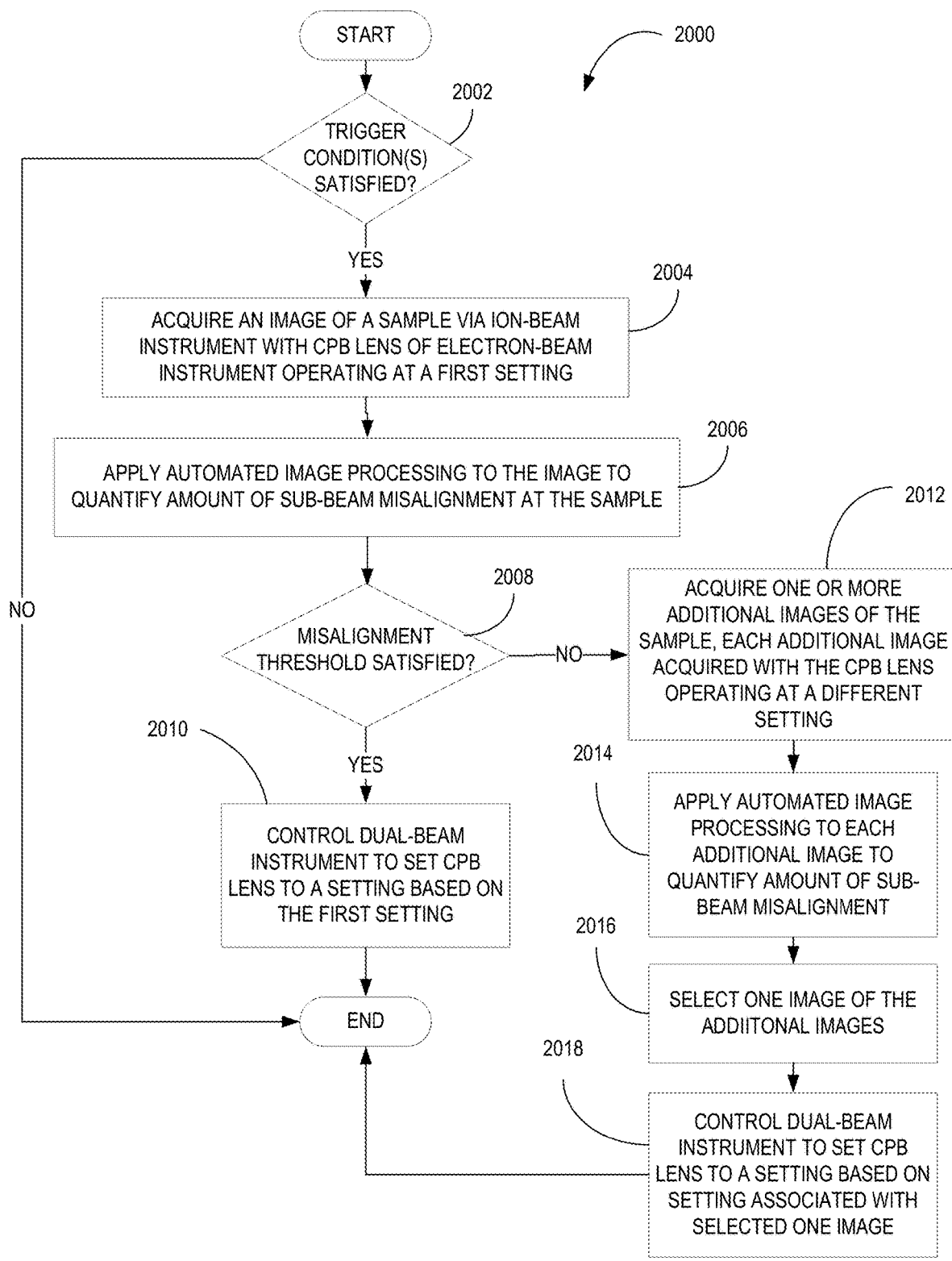
FIG. 2 is a flow diagram of an example method of performing support operations, in accordance with various embodiments.

FIG. 2 is a flow diagram of an automated method 2000 of performing support operations, in accordance with various embodiments. Although the operations of the method 2000 may be illustrated with reference to particular embodiments disclosed herein (e.g., the scientific instrument support module 1000 discussed herein with reference to FIG. 1, the computing devices 7000 discussed herein with reference to FIG. 7, and/or the scientific instrument support system 8000 discussed herein with reference to FIG. 8), the method 2000 may be used in any suitable setting to perform any suitable support operations. Operations are illustrated once each and in a particular order in FIG. 2, but the operations may be reordered and/or repeated as desired and appropriate (e.g., different operations performed may be performed in parallel, as suitable). Also, although operations may be described as being performed by one of the first, second, or third logics 1002, 1004, and 1006 of the scientific instrument support module 1000, the operations may be distributed in various ways among any number of modules or logic.

As described below, the method 2000 represents a support method of a scientific instrument, such as, for example, a dual-beam instrument that includes an ion-beam instrument and an electron-beam instrument, wherein the support method automatically determines an optimized setting for a CPB lens included in the electron-beam instrument to reduce or minimize ion beam splitting caused by the CPB lens and automatically controls the dual-beam instrument to set the CPB lens to the determined optimized setting. As noted above, the automated beam alignment performed via the support method 2000 may beneficially be used, for example, to improve the accuracy of operations performed by the dual-beam instrument, such as, for example, imaging, and/or to reduce the instrument setup time.

The method 2000 is described herein with respect to one CPB lens of an electron-beam instrument included in a dual-beam instrument, such as, for example, a UHR lens. However, in other embodiments, other types of CPB lenses may be controlled as described herein and, in some embodiments, two or more CPB lenses of the electron-beam instrument may be controlled to align ion sub-beams at a sample being processed by the dual-beam instrument.

Prior to executing the support method 2000, the dual-beam instrument may be appropriately prepared and configured for operation. For example, a sample may be selected and placed into a holder in a vacuum chamber of the dual-beam instrument. As described below in more detail with respect to the dual-beam instrument 9000 illustrated in FIG. 9, one or more valves included in the dual-beam instrument may be appropriately operated to deliver selected gas(es) to a plasma source, and ion-beam optics included in the ion-beam instrument may be appropriately configured for scanning an ion beam across sample. One or more detectors included in the dual-beam instrument may also be turned "ON" and configured for measurements.

At block 2002 of the method 2000, the first logic 1002 may determine whether one or more trigger conditions of the support method 2000 are satisfied. As noted above, beam splitting may occur during particular operating conditions of the dual-beam instrument and, thus, the support method 2000 may be executed only when one or more triggering conditions representing such operating conditions are satisfied. The one or more triggering conditions may include the ion-beam instrument of the dual-beam instrument being used independently of the electron-beam instrument, the ion-beam instrument using a particular mixture of gases, the ion-beam instrument switching between gases (wherein residual gases may exist), or a combination thereof.

In response to the one or more triggering conditions not being satisfied, the support method 2000 may end as not being needed. However, in some embodiments, in this situation, the first logic 1002 may continue to check or determine whether the one or more triggering conditions are satisfied (e.g., as operating conditions of the dual-beam instrument may change during operation of the dual-beam instrument). However, in other embodiments, the support method 2000 may only be executed at initiation or start-up of the dual-beam instrument.

Alternatively, in response to the one or more triggering conditions being satisfied, the first logic 1002 may acquire an image of the sample at block 2004 by causing the ion-beam instrument of the dual-beam instrument to scan an ion beam across a sample and detect, via one or more detectors of the dual-beam instrument, emission from the sample produced in response to the ion beam. As described below with respect to the dual-beam instrument 9000 illustrated in FIG. 9, in some embodiments, the ion beam is scanned across the sample in raster pattern while the one or more detectors measures the flux of secondary electrons emitted from the sample. The scan information and corresponding measurement data from the one or more detectors are used to generate an image. As noted above, the ion beam generated via the ion-beam instrument includes first and second sub-beams having ions of different respective mass-to-charge ratios.

The image acquired at block 2004 is acquired with the CPB lens of the electron-beam instrument operating at a first or initial setting (e.g., a first or initial AT setting). In some embodiments, the first CPB lens setting may be manually set by a user or may be programmed as a default setting or configuration for the dual-beam instrument. Also, in some embodiments, the first CPB lens may be automatically selected based on one or more operating conditions of the dual-beam instrument, such as, for example, an ion species being used by the ion-beam instrument, an energy level of the ion-beam instrument, or a combination thereof.

At block 2006, the second logic 1004 may apply automated image processing to the image acquired at block 2004 to quantify an amount of spatial misalignment of the first and second sub-beams at the sample represented within the image. Further details of this automated image processing are provided below with respect to block 2014. However, in some embodiments, the second logic 1004 may apply automated image processing to the image acquired at block 2004 to define an area, perimeter, or roundness of overlapping sub-beams represented within the image.

At block 2008, the third logic 1006 may compare the quantified amount of spatial misalignment represented within the image to a threshold. Again, additional details regarding quantifying spatial misalignments, wherein such quantities or values may be applied to various thresholds, are provided below with respect to block 2014. However, in some embodiments, the threshold applied at block 2008 may be defined in terms of an area of overlapping sub-beams represented within the image, a perimeter of overlapping sub-beams represented within the image, a roundness of an area of overlapping sub-beams represented within the image, or a combination thereof.

As illustrated in FIG. 2, in response to the quantified amount of spatial misalignment satisfying the threshold, that is, with no significant misalignment being detected, the third logic 1006 may control the dual-beam instrument to set the CPB lens of the electron-beam instrument to a setting based on the first setting of the CPB lens (at block 2010). In some embodiments, at block 2008, the third logic 1006 controls the dual-beam instrument to set the CPB lens to the first setting (if not already set accordingly). In other embodiments, the third logic 1006 controls the dual-beam instrument to set the CPB lens at block 2008 to the first setting plus or minus an adjustment factor, which may be a default amount or may be selected based on the amount of misalignment represented within the image, other operation settings of the dual-beam instrument, or a combination thereof. As noted above, in some embodiments, the third logic 1006 sets the CPB lens to a particular setting by transmitting one or more control signals to a component of the dual-beam instrument responsible for adjusting a setting of the CPB lens (e.g., setting an AT level of the CPB lens), automatically controlling a "double spot compensation" alignment mechanism of the dual-beam instrument, or a combination thereof.

As illustrated in FIG. 2, in response to the quantified amount of spatial misalignment not satisfying the threshold, one or more additional images may be acquired via the first logic 1002 at block 2012. In other words, the image acquired at block 2004 may act as a "test image," wherein an amount of spatial misalignment represented within the test image may be used to determine whether operation of the CPB lens should be adjusted to reduce or minimize spatial misalignment of the sub-beams during use of the ion-beam instrument.

The one or more additional images acquired at block 2012 are acquired as described above with respect to block 2004 by scanning the ion beam across the sample. Each additional image acquired at block 2012 is acquired with the CPB lens of the electron-beam instrument operating at a different setting, such as, for example, a different AT setting. Accordingly, each additional image acquired at block 2012 is associated with a different setting of the CPB lens of the electron-beam instrument and this association may be recorded in metadata or header information of the image or in separate data record or structure.

The number of additional images acquired at block 2012 and the range of CPB lens settings associated with such additional images may vary and may be configured by a user or automatically determined. For example, a range of CPB lens settings, an increment between each setting, or both may be selected manually by an operator of the dual-beam instrument (e.g., via a human machine interface associated with the scientific instrument). Alternatively, the range of settings, the increment, or both may be programmed as part of configuration settings for the dual-beam instrument (e.g., as a default range, a default increment, or both). Also, in some embodiments, the range of settings, the increment, or both may be automatically selected based on, for example, the test image described above with respect to blocks 2004 through 2008, an ion species being used by the ion-beam instrument, other operating conditions of the dual-beam instrument, the sample, or a combination thereof. For example, the quantified amount of spatial misalignment determined for the test image described above may be used to automatically select the range of settings, the increment, or both. For example, in this embodiment, in response to the test image having severe spatial misalignment (e.g., as compared to the threshold used at block 2008 or a separate severity threshold), a wider (as compared to a default range) range of settings, a larger increment (as compared to a default increment), or both may be automatically selected. Alternatively, in response to the test image having less severe spatial misalignment (e.g., as compared the threshold used at block 2008 or a separate severity threshold), a narrower range of settings, a smaller increment, or both may be automatically selected. In some embodiments, the range of settings of the CPB lens may be a range of AT settings, which may range between, for example, −25 AT and +25 AT, and the increment may be, for example, 1.0 AT or 0.5 AT. However, in other embodiments, different ranges, increments, or both may be used depending on the type or configuration of the dual-beam instrument, the sample being imaged, an amount of spatial misalignment detected within the test image, or a combination thereof.

Also, for at least some samples, one or more operation settings of the ion-beam instrument may be selected (e.g., automatically or manually) for acquiring the test image at block 2004, the one or more additional images at block 2012, or both to prevent or mitigate possible damages to the sample that may otherwise be associated with repeated ion-beam scanning over the same area of the sample as part of acquiring multiple images. Such operation settings may include, for example, ion current, ion energy, beam size, or a combination thereof. For example, in some embodiments, a small (e.g., smallest available per specifications of the dual-beam instrument) beam size may be used when acquiring the test image, one or more additional images, or a combination thereof to reduce possible adverse effects of the ion beam on the sample and, in particular, an area of the sample that may be repeatedly scanned. Using a small beam size may also allow ghost or double image artifacts, as described below with respect to the second logic 1004, to be detected more efficiently as, generally, an overlap between smaller beams causes a more non-circular image defect than the same amount of overlap in larger beams.

Figure 3:
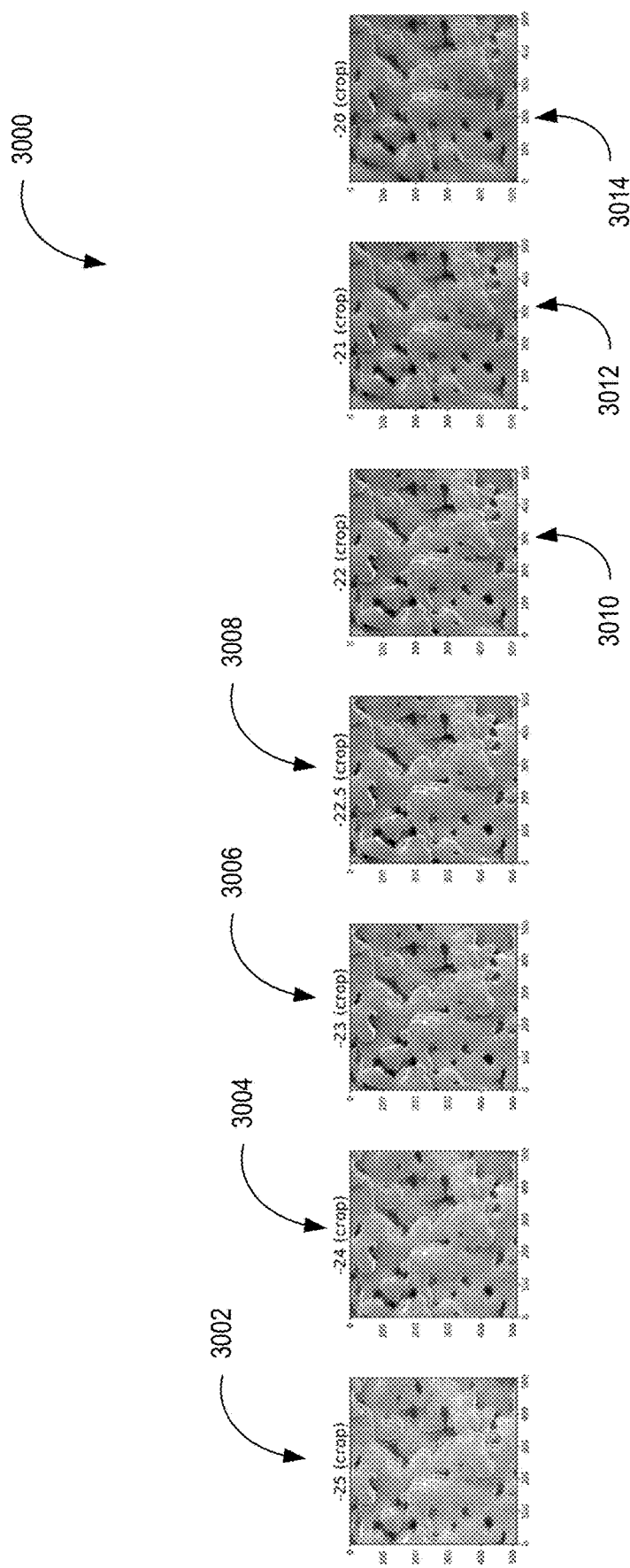
FIG. 3 illustrates example images acquired as part of the method of FIG. 2, in accordance with various embodiments.

FIG. 3 illustrates an example set of additional images 3000, including images 3002, 3004, 3006, 3008, 3010, 3012, and 3014, that may be acquired as part of block 2012 according to an embodiment. In this particular example, the sample S is POCO graphite, the selected gas is O2, the range of settings for the CPB lens ranges from −25 AT to −20 AT, and the increment is 0.5 AT. The set of images 3000 illustrated in FIG. 3 represent example images and may not represent the full set of images acquired as part of block 2012 (i.e., the set of images acquired via at block 2012 may include fewer or more images). Also, each of the images 3002, 3004, 3006, 3008, 3010, 3012, and 3014 illustrated in FIG. 3 is cropped for illustration purposes.

Returning to FIG. 2, the second logic 1004 receives the additional one or more images acquired at block 2012 as well as information regarding the setting the CPB lens of the electron-beam instrument was operating when each additional image was acquired (which may be included as metadata or header information for the acquired images or in a separate data structure or record) and applies automated image processing to the one or more additional images acquired to quantify an amount of spatial misalignment of the first and second sub-beams at the sample represented within each additional image (at block 2014). In some embodiments, to quantify an amount of spatial misalignment represented within each image, the second logic 1004 may use automated image processing to detect the presence of an image artifact within an image and quantity the severity of the detected image artifact. For example, when the monoatomic and diatomic (e.g., O+ and O2+) ion sub-beams of an ion beam are not properly aligned at the sample, an acquired image may include a ghost or double image artifact. For example, as best seen in image 3002 and image 3008 illustrated in FIG. 3, misalignment of the sub-beams of the ion beam may create two superimposed images, which are shifted with respect to one another. The distance between the superimposed images and the direction of the corresponding image-shift vector may be indicative of (i) the distance between the spots at which the monoatomic and diatomic ion sub-beams of the ion beam hit the sample and (ii) the orientation, in the XY plane, of the line drawn through those two spots. Accordingly, the automated image processing applied by the second logic 1004 may detect the presence of ghost or double image artifacts within each image and quantify a severity of this defect, which represents a quantity of sub-beam misalignment represented within the image.

Figure 4:
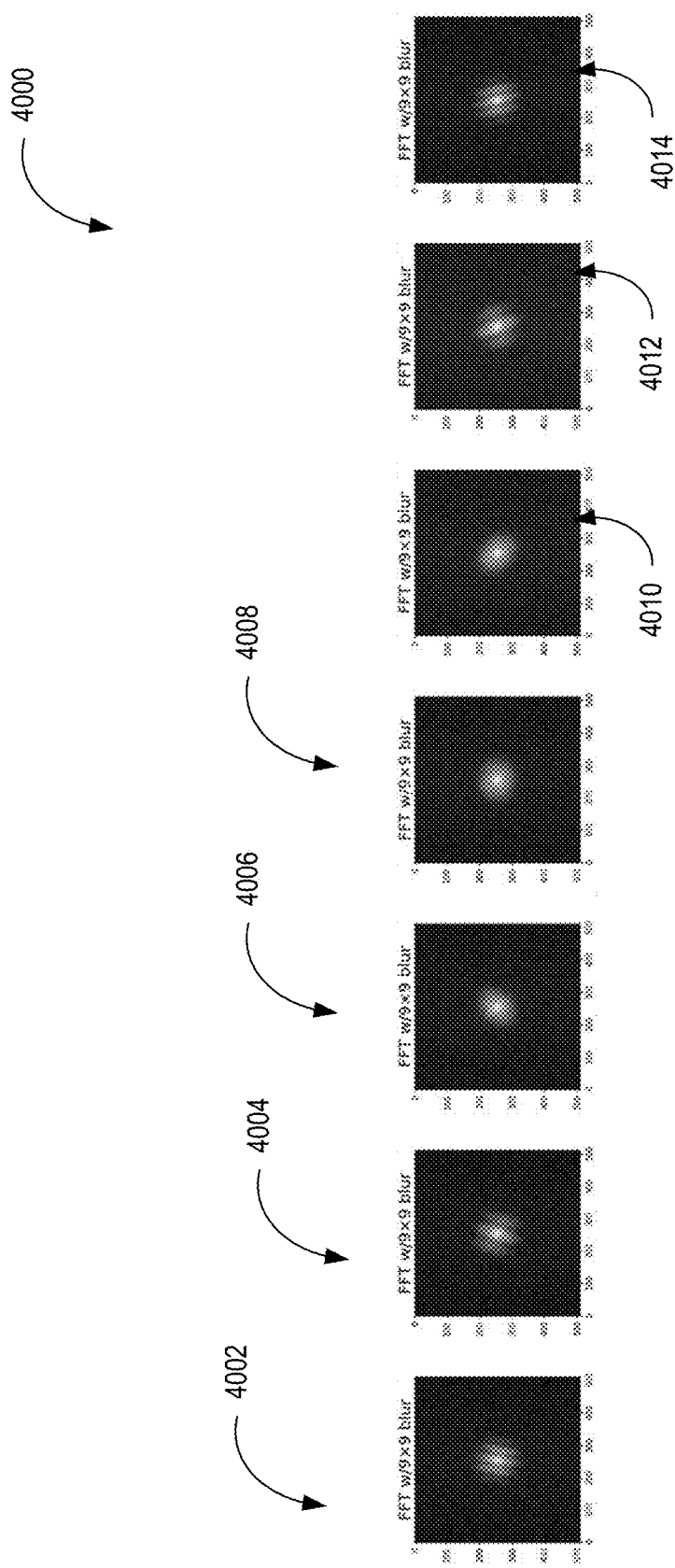
FIG. 4 graphically illustrates a respective Fast Fourier Transform (FFT) generated for each image of FIG. 3, in accordance with various embodiments.

For example, FIG. 4 graphically illustrates automated image processing that may be applied to the images 3000 according to some embodiments. As illustrated in FIG. 4, in some embodiments, Fourier transforms 4000 are generated for the images 3000 by applying a fast-Fourier-transform (FFT) operation to each of the images 3000 (the resulting Fourier transforms represented as transforms 4002, 4004, 4006, 4008, 4010, 4012, and 4014). In this particular example, the FFT operation is applied together with averaging over 9×9 square pixel blocks. Other averaging parameters may be used in other embodiments.

Figure 5:
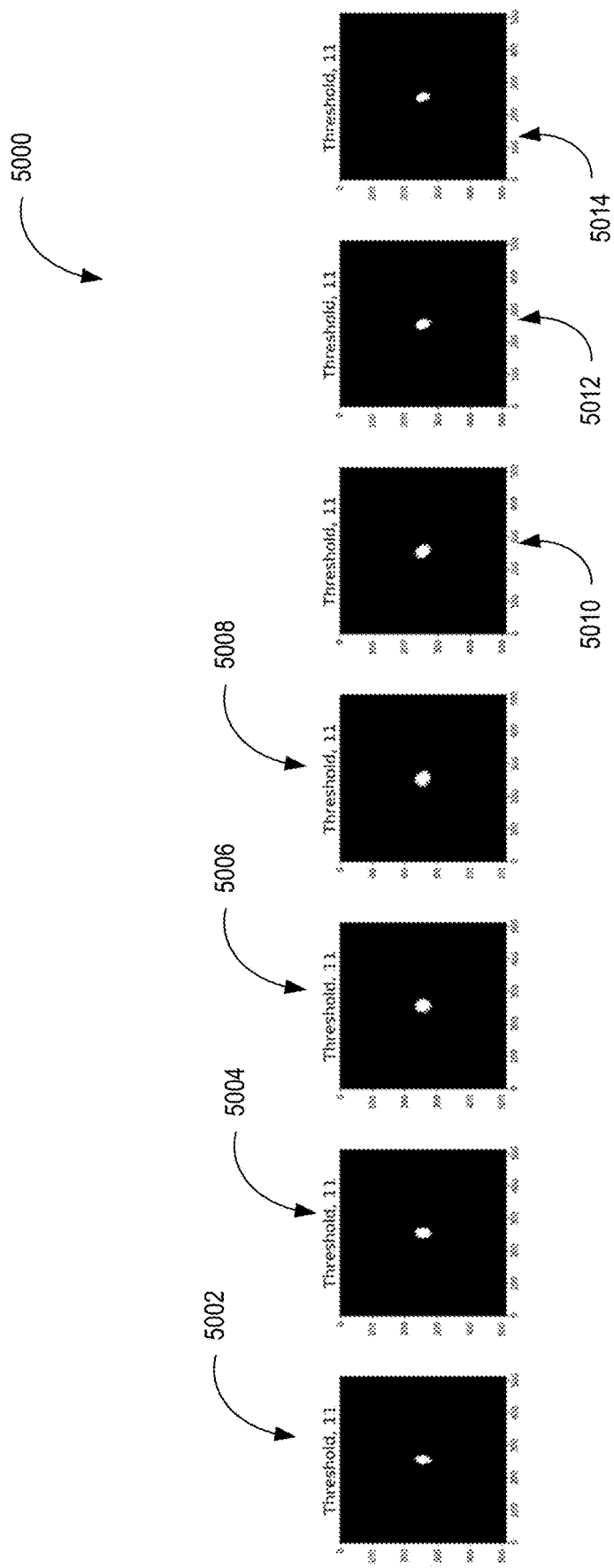
FIG. 5 graphically illustrates a respective binary FFT map generated for each image of FIG. 3, in accordance with various embodiments.

One or more thresholding operations may also be applied as part of the automated image processing. For example, FIG. 5 illustrates the Fourier transforms 4000 after application of a thresholding operation. A thresholding operation transforms an image (e.g., a greyscale image) into a binary image, wherein pixel values are either 0 or 1. Upon thresholding, pixel values smaller than a selected fixed threshold are forced to zero, whereas pixel values equal to or greater than the selected fixed threshold are forced to one. As illustrated in FIG. 5, a thresholding operation is applied to each of the Fourier transforms 4000 to generate FFT maps 5000 (represented as binary FFT maps 5002, 5004, 5006, 5008, 5010, 5012, and 5014). In the illustrated FFT maps 5000, a threshold of 11 was applied. Other thresholds or filtering operations and other threshold values (other than 11) may be used in place of or in addition to the illustrated thresholding.

Figures 6A, 6B, 6C:
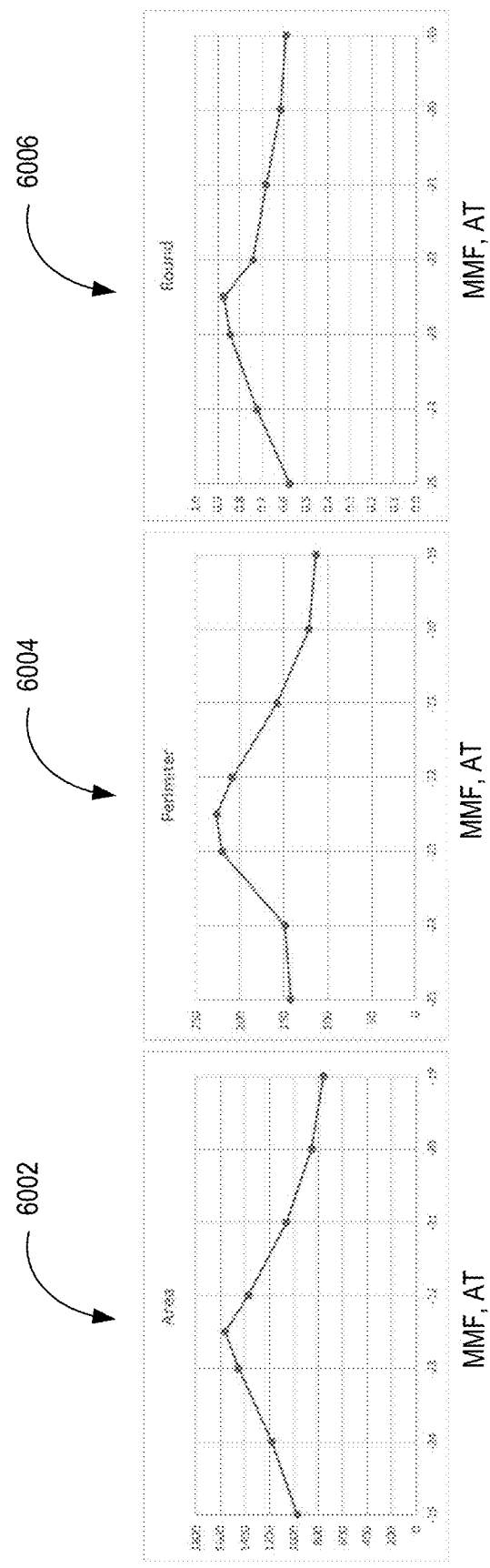
FIGS. 6A, 6B, and 6C graphically illustrate plots of parameters of the binary FFT maps of FIG. 5, in accordance with various embodiments.

The generated binary FFT maps 5000 may be used to quantify an amount of spatial misalignment represented within an image. For example, the "white" areas in the binary FFT maps 5000 (e.g., the pixels forced to a 1 value during the thresholding operation described above) represent two sub-beams in shifted positions caused by beam splitting. Analyzing parameters of these "white" areas, thus, provides metrics of the severity of the sub-beam misalignment or, in other words, quantify a spatial misalignment of the ion sub-beams. For example, FIGS. 6A-6C graphically illustrate plots 6002, 6004, and 6006, respectively, of parameters that may be used to quantify the spatial misalignment of sub-beams represented within an image according to various embodiments. The plots illustrated in FIGS. 6A-6C are based on the binary FFT maps illustrated in FIG. 5. FIG. 6A illustrates a plot 6002 of the "white" area of the binary FFT maps as a function of the AT setting of the CPB lens of the electron-beam instrument (i.e., representing a magnetomotive force (MFF) applied by the CPB lens). FIG. 6B illustrates a plot 6004 of the perimeter of the "white" area of the binary FFT maps as a function of the AT setting of the CPB lens of the electron-beam instrument. FIG. 6C illustrates a plot 6006 of the roundness of the "white" area of the binary FFT maps as a function of the AT setting of the CPB lens of the electron-beam instrument. "Roundness" may be a parameter that quantifies how close an arbitrary shape is to the shape of a circle, with the roundness value of 1 being assigned to a proper circle. As described in further detail below, these perimeters may be used to select an image representing an optimal CPB lens setting.

At block 2016, the third logic 1006 may determine, based on the quantified amount of spatial misalignment represented within each additional image (determined as part of block 2014), the CPB lens setting corresponding to an approximately minimum amount of misalignment. In some examples, one image of the one or more additional images may be selected and then, at block 2018, the controller may control the dual-beam instrument to set the CPB lens of the electron-beam instrument to a setting based on the respective setting of the CPB lens associated with the selected one image. In some other examples, two images of the additional images may be selected and then, at block 2018, the controller may control the dual-beam instrument to set the CPB lens of the electron-beam instrument to a setting determined based on an interpolation, extrapolation, or a combination thereof of the respective settings of the CPB lens associated with the selected two images. In other words, at block 2016, the third logic 1006 uses the image processing performed on the one or more additional images via the second logic 1004 to select a single image or a pair of images, wherein the CPB lens setting(s) associated with the selected image(s) represent(s) an approximately optimized setting of the CPB lens of the electron-beam instrument. As noted above, in some embodiments, the CPB lens setting associated with a particular image may be included in metadata or header data of an image or may be stored in a separate data structure.

In some embodiments, the third logic 1006 may select the one image by identifying an image, from the one or more additional images acquired at block 2012, having a minimum amount of spatial misalignment. For example, in some embodiments, the third logic 1006 may use one or more of the above-described parameters (i.e., area, perimeter, or roundness) of the binary FFT map to select an image, such as by comparing values of one of these parameters to identify an image having a particular parameter value (e.g., a minimum value, a maximum value, or the like). For example, each of the parameters plotted in FIGS. 6A-6C has a maximum value at −22.5 AT. Accordingly, this AT setting represents an optimized setting of the CPB lens (within the range of settings) as this AT setting results in an image having the weakest (e.g., substantially suppressed) ghost-image artifact therein and, therefore, minimum misalignment of sub-beams of the ion beam. Thus, in this example, the third logic 1006 may use one or more of the parameter values represented in FIGS. 6A-6C to select an image, wherein, in this particular example, the third logic 1006 selects an image by identifying an image having a maximum value for one or more of the example parameters (e.g., maximum area, maximum perimeter, maximum roundness, or a combination thereof).

In other embodiments, the third logic 1006 may select the one image by identifying an image, from the one or more additional images acquired at block 2012, having an amount of spatial misalignment satisfying one or more thresholds. In some embodiments, the third logic 1006 may use the same threshold applied to the test image (see, e.g., block 2008). However, in other embodiments, one or more other thresholds may be used. In some embodiments, the third logic 1006 may compare one or more of the parameter values represented in FIGS. 6A-6C to one or more thresholds (e.g., defined in terms of area, perimeter, or roundness) to select an image.

In some embodiments, the third logic 1006 may use a combination of the above selection approaches to select an image. For example, in some embodiments, the third logic 1006 may determine an image, from the one or more additional images acquired at block 2012, having a minimum amount of spatial misalignment and may compare the amount of spatial misalignment represented within this image to a threshold, such as the threshold described above with respect to the test image. Other selection processes may also be used depending on how spatial misalignment is quantified by the second logic 1004.

After selecting the image, the third logic 1006 automatically controls the dual-beam instrument to set the CPB lens of the electron-beam instrument to a setting based on the setting associated with the selected image at block 2018. In some embodiments, the third logic 1006 controls the dual-beam instrument to set the CPB lens to the setting associated with the selected image. In other embodiments, the third logic 1006 controls the dual-beam instrument to set the CPB lens to the setting associated with the selected image plus or minus an adjustment factor, which may be a default amount or may be selected based on the amount of misalignment represented within the selected image, other operation settings of the dual-beam instrument, or a combination thereof. As noted above, in some embodiments, the third logic 1006 sets the CPB lens to a particular setting by transmitting one or more control signals to a component of the dual-beam instrument responsible for adjusting a setting of the CPB lens (e.g., setting an AT level of the CPB lens), automatically controlling a "double spot compensation" alignment mechanism of the dual-beam instrument, or a combination thereof.

As noted above, in some embodiments, the identified optimized setting of the CPB lens (e.g., applied at block 2010, bock 2018, or both) is stored, such as in a look-up table or similar data structure, that maps one or more operation settings of the dual-beam instrument to optimized settings of the CPB lens of the electron-beam instrument. The operation settings of the dual-beam instrument may include, for example, energy levels of the ion-beam instrument, an ion species, other operating conditions or environments of the dual-beam instrument or the sample, or a combination thereof. Accordingly, when the dual-beam instrument is used in the future to process a sample via the ion-beam instrument, in some embodiments, the stored optimized setting for the CPB lens of the electron-beam instrument may be read from the look-up table and applied. In other embodiments, in addition to or as an alternative to creating a look-up table, the method 2000 or a portion thereof as described herein may be performed in-situ, which allows the method 2000 to react to the specific operating environment of the dual-beam instrument, including the specific sample being imaged, which may also impact beam splitting. Also, in some embodiments, a look-up table created as noted above may be used to establish a CPB lens setting for acquiring a test image as described above (see, e.g., block 2004), to establish the range of settings and/or increment for acquiring one or more additional images, to verify an optimized setting identified during an in-situ version of the method 2000, or a combination thereof.

In some embodiments, the acquisition of one or more additional images as described above with respect to block 2012 and the associated automated image processing as described above with respect to block 2014 may be performed in an iterative fashion. For example, in response to results of processing an initial set of one or more additional images acquired and processed as described above, a further set of one or more additional may be acquired using, for example, a different tuning range, different increment, or combination thereof. This sequence of processing may be performed in any number of iterations until an image is selected as representing an acceptable amount of sub-beam misalignment (e.g., as compared one or more thresholds). As one example, an initial set of additional images may be acquired using a range of CPB lens settings extending in a first numerical direction from the first setting of the CPB lens used with the test image and the results of processing this initial set of additional images may control whether a second set of additional images are acquired in a second numerical direction opposite the first direction. Similarly, an initial set of additional images may be obtained according to an initial range of settings and an initial increment, and the results of processing these images as described herein may be used to define a second, narrower range of settings, a second, smaller increment, or a combination thereof to drill down to an optimized setting for the CPB lens. The number and parameters for such iterations may be configured as part of configuration settings for the dual-beam instrument, which may, in some embodiments, be programmed manually by a user.

Also, in some embodiments, additional images may be acquired and processed as described above (see blocks 2012 and 2014) in a serial manner as compared to acquiring a set of images and processing the set of images. In response to acquiring an additional image with an acceptable amount of spatial misalignment (e.g., satisfying a threshold), the image may be used as the selected image as described above and the CPB lens is set based on the CPB lens setting associated with the selected image. Accordingly, although FIG. 3 and related FIGS. 4-6 illustrate acquiring and processing a set of multiple images, this represent one, non-limiting example and the method 2000 is not limited to this example embodiment.

Furthermore, in some embodiments, acquiring and processing a test image as described above with respect to blocks 2004, 2006, and 2008 of method 2000 represents an optional portion of the method 2000. For example, in some embodiments, the method 2000 includes initially acquiring a plurality of images at different CPB lens settings, wherein the range of settings and increment associated with the plurality of images are manually configured (e.g., as a default range, increment, or combination thereof) or automatically set, such as, for example, based on one or more operating parameters of the dual-beam instrument, data read from an previously-established look-up table, as described above, or a combination thereof.

The automated image processing and image selection described above with respect to the generation of binary FFT maps and parameters of sub-beam overlaps represented within such maps provide one, non-limiting example of automated image processing applied via the method 2000. In other embodiments, other suitable automated image processing techniques are possible. For example, as noted above, sub-beam misalignment may be represented as ghost or double image artifacts. Detection of this type of artifact may be used in other imaging applications, and the corresponding image-processing methods used in these applications may be adapted for use in identifying and quantifying ghost or double image artifacts within an acquired image without undue experimentation. For example, various artifact detection techniques may be used to detect a ghost or double image artifact within an acquired image and, similarly, various artifact detection techniques may be used to quantify such an artifact, such as by identifying an adjustment amount that would be needed to remove or correct such a detected image artifact. In other words, this adjustment amount may be used to quantify the image artifact and, thus, used to select an image associated with an optimized CPB lens setting as described above with respect to the method 2000.

For example, in some embodiments, the automated image processing performed via the second logic 1004 may include using a 2-tap or other suitable finite-impulse-response (FIR) filter to identify a ghost image artifact within an acquired image. The configuration (e.g., the delay and tap coefficients) of the FIR filter that could be used to remove the ghost image from the acquired image may be determined using a suitable least-mean-squares (LMS) algorithm, and different FIR-filter configurations may be needed to de-ghost different acquired images based on the severity of the ghost image present in each image. Accordingly, in some embodiments, delay values corresponding to such different FIR-filter configurations may be plotted as a function of the setting of the CPB lens in a manner like that of FIGS. 6A-6C, and an image may be selected via the third logic 1006 as described above based on the associated delay values. For example, an image associated with a minimum delay value (among the delay values of a set of images) may be associated with a minimum amount of sub-beam misalignment and, accordingly, may be selected as the image associated with an optimized CPB lens setting.

In yet other embodiments, a ghost image may be treated like an echo signal often encountered in the field of seismic imaging. Such echo signal may be substantially canceled by applying, to an individual image, a sparse Tau-P transform. Accordingly, one or more suitably selected parameters of the sparse Tau-P transforms corresponding to different acquired images may be plotted as a function of the setting of the CPB lens in a manner like that of FIGS. 6A-6C and used to select an image associated with an optimized CPB lens setting as described above.

In yet further embodiments, the second logic 1004 may decompose an acquired image into two sub-images, with each of the sub-images being a scaled copy of the respective "master" image and with the scaled copies being shifted with respect to one another by a shift vector. The master image, values of the scaling coefficients, and shift vector may be determined, such as, for example, by using a suitable LMS algorithm, and, in some embodiments, the absolute value of the shift vector for a particular image may be used to select an image representing an optimized CPB lens setting. For example, when multiple images are acquired and processed, the third logic 1006 may select an image representing an optimized CPB lens setting by selecting the image having a minimum absolute value of the shift vector.

One or more of the above image processing techniques, or a combination thereof, may be applied via the second logic 1004 and the third logic 1006 as part of the method 2000 described above to identify an optimized setting of the CPB lens of the electron-beam instrument, wherein the identified optimized setting of the CPB lens is used as described above with respect to the third logic 1006 to set the CPB lens to an appropriate setting for improving performance of the ion-beam instrument of the dual-beam instrument. Also, as noted above, in some embodiments, the same automated image processing is performed with respect to the test image (at block 2006) as performed for one or more additional images (at block 2014). However, in other embodiments, different image processing may be performed with respect to the test image as compared to one or more additional images. For example, in some embodiments, the automated image processing performed with respect to the test image may include using a 2-tap or other suitable finite-impulse-response (FIR) filter, a sparse Tau-P transform, or a shift vector as described above, wherein the one or more additional images may be processed using FFT transforms as also described above. Furthermore, in some embodiments, multiple different image processing techniques may be applied as part of processing a test image or one or more additional images, wherein metrics from different image processing techniques may be combined or compared to select an image representing an optimal setting for the CPB lens and, in some embodiments, metrics may be scored based on the accuracy of image processing techniques in identifying and quantifying spatial misalignment.

Figure 7:
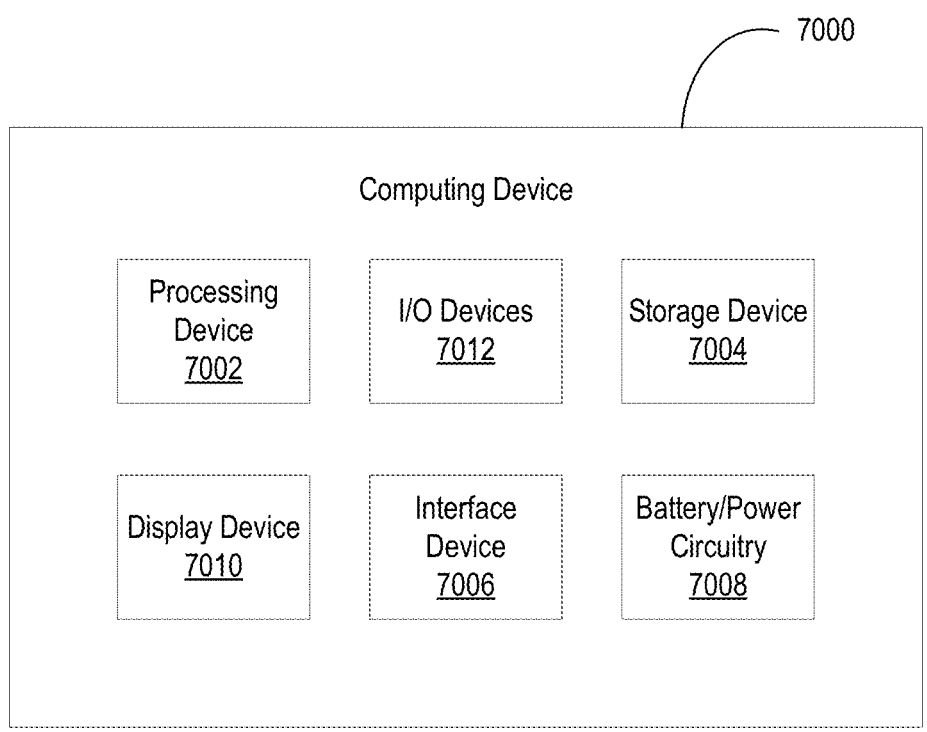
FIG. 7 is a block diagram of an example computing device that may perform some or all of the scientific instrument support methods disclosed herein, in accordance with various embodiments.
Figure 8:
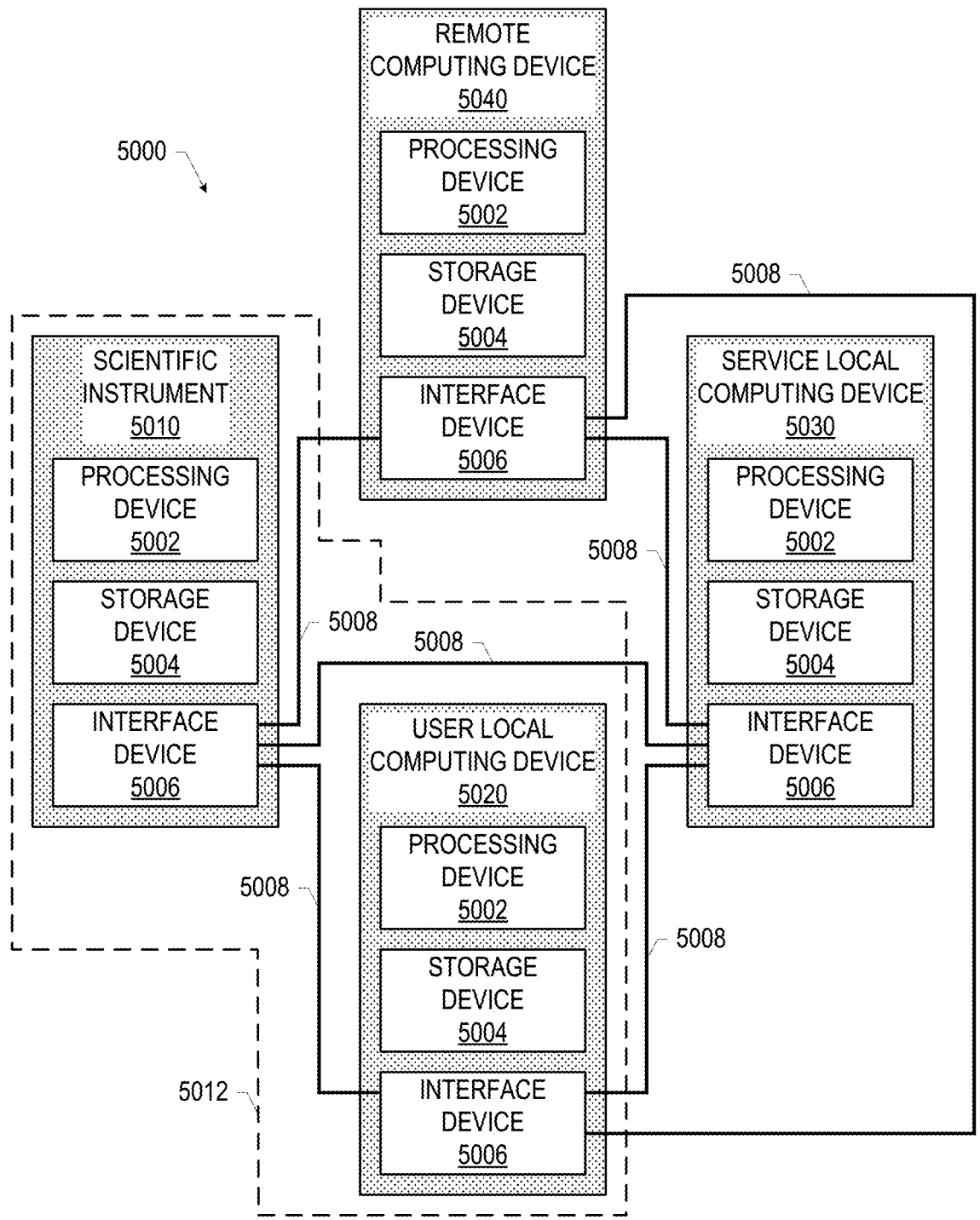
FIG. 8 is a block diagram of an example scientific instrument support system in which some or all of the scientific instrument support methods disclosed herein may be performed, in accordance with various embodiments

The scientific instrument support methods disclosed herein may include interactions with a human user (e.g., via the user local computing device 8020 discussed herein with reference to FIG. 8). These interactions may include providing information to the user (e.g., information regarding the operation of a scientific instrument, such as the scientific instrument 8010 of FIG. 8, information regarding a sample being analyzed or other test or measurement performed by a scientific instrument, information retrieved from a local or remote database, or other information) or providing an option for a user to input commands (e.g., to control the operation of a scientific instrument, such as the scientific instrument 8010 of FIG. 8, or to control the analysis of data generated by a scientific instrument), queries (e.g., to a local or remote database), or other information. In some embodiments, these interactions may be performed through a graphical user interface (GUI) that includes a visual display on a display device (e.g., the display device 7010 discussed herein with reference to FIG. 7) that provides outputs to the user and/or prompts the user to provide inputs (e.g., via one or more input devices, such as a keyboard, mouse, trackpad, or touchscreen, included in the other I/O devices 7012 discussed herein with reference to FIG. 7). The scientific instrument support systems disclosed herein may include any suitable GUIs for interaction with a user.

As noted above, the scientific instrument support module 1000 may be implemented by one or more computing devices. FIG. 7 is a block diagram of a computing device 7000 that may perform some or all of the scientific instrument support methods disclosed herein, in accordance with various embodiments. In some embodiments, the scientific instrument support module 1000 may be implemented by a single computing device 7000 or by multiple computing devices 7000. Further, as discussed below, a computing device 7000 (or multiple computing devices 7000) that implements the scientific instrument support module 1000 may be part of one or more of the scientific instrument 8010, the user local computing device 8020, the service local computing device 8030, or the remote computing device 8040 of FIG. 8.

The computing device 7000 of FIG. 7 is illustrated as having a number of components, but any one or more of these components may be omitted or duplicated, as suitable for the application and setting. In some embodiments, some or all of the components included in the computing device 7000 may be attached to one or more motherboards and enclosed in a housing (e.g., including plastic, metal, and/or other materials). In some embodiments, some of these components may be fabricated onto a single system-on-a-chip (SoC) (e.g., an SoC may include one or more processing devices 7002 and one or more storage devices 7004). Additionally, in various embodiments, the computing device 7000 may not include one or more of the components illustrated in FIG. 7, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 7000 may not include a display device 7010, but may include display device interface circuitry (e.g., a connector and driver circuitry) to which a display device 7010 may be coupled.

The computing device 7000 may include a processing device 7002 (e.g., one or more processing devices). As used herein, the term "processing device" may refer to any device or portion of a device that processes electronic data from registers and/or memory to transform that electronic data into other electronic data that may be stored in registers and/or memory. The processing device 7002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 7000 may include a storage device 7004 (e.g., one or more storage devices). The storage device 7004 may include one or more memory devices such as random-access memory (RAM) devices (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 7004 may include memory that shares a die with a processing device 7002. In such an embodiment, the memory may be used as cache memory and may include embedded dynamic random-access memory (eDRAM) or spin transfer torque magnetic random access memory (STT-MRAM), for example. In some embodiments, the storage device 7004 may include non-transitory computer readable media having instructions thereon that, when executed by one or more processing devices (e.g., the processing device 7002), cause the computing device 7000 to perform any appropriate ones of or portions of the methods disclosed herein.

The computing device 7000 may include an interface device 7006 (e.g., one or more interface devices 7006). The interface device 7006 may include one or more communication chips, connectors, and/or other hardware and software to govern communications between the computing device 7000 and other computing devices. For example, the interface device 7006 may include circuitry for managing wireless communications for the transfer of data to and from the computing device 7000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 7006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). In some embodiments, circuitry included in the interface device 7006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 7006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 7006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 7006 may include one or more antennas (e.g., one or more antenna arrays) to receipt and/or transmission of wireless communications.

In some embodiments, the interface device 7006 may include circuitry for managing wired communications, such as electrical, optical, or any other suitable communication protocols. For example, the interface device 7006 may include circuitry to support communications in accordance with Ethernet technologies. In some embodiments, the interface device 7006 may support both wireless and wired communication, and/or may support multiple wired communication protocols and/or multiple wireless communication protocols. For example, a first set of circuitry of the interface device 7006 may be dedicated to shorter-range wireless communications such as Wi-Fi or Bluetooth, and a second set of circuitry of the interface device 7006 may be dedicated to longer-range wireless communications such as global positioning system (GPS), EDGE, GPRS, CDMA, WiMAX, LTE, EV-DO, or others. In some embodiments, a first set of circuitry of the interface device 7006 may be dedicated to wireless communications, and a second set of circuitry of the interface device 7006 may be dedicated to wired communications.

The computing device 7000 may include battery/power circuitry 7008. The battery/power circuitry 7008 may include one or more energy storage devices (e.g., batteries or capacitors) and/or circuitry for coupling components of the computing device 7000 to an energy source separate from the computing device 7000 (e.g., AC line power).

The computing device 7000 may include a display device 7010 (e.g., multiple display devices). The display device 7010 may include any visual indicators, such as a heads-up display, a computer monitor, a projector, a touchscreen display, a liquid crystal display (LCD), a light-emitting diode display, or a flat panel display.

The computing device 7000 may include other input/output (I/O) devices 7012. The other I/O devices 7012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 7000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 7000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra mobile personal computer, etc.), a desktop computing device, or a server computing device or other networked computing component.

One or more computing devices implementing any of the scientific instrument support modules or methods disclosed herein may be part of a scientific instrument support system. FIG. 8 is a block diagram of an example scientific instrument support system 8000 in which some or all of the scientific instrument support methods disclosed herein may be performed, in accordance with various embodiments. The scientific instrument support modules and methods disclosed herein (e.g., the scientific instrument support module 1000 of FIG. 1 and the method 2000 of FIG. 2) may be implemented by one or more of the scientific instrument 8010, the user local computing device 8020, the service local computing device 8030, or the remote computing device 8040 of the scientific instrument support system 8000.

Any of the scientific instrument 8010, the user local computing device 8020, the service local computing device 8030, or the remote computing device 8040 may include any of the embodiments of the computing device 7000 discussed herein with reference to FIG. 7, and any of the scientific instrument 8010, the user local computing device 8020, the service local computing device 8030, or the remote computing device 8040 may take the form of any appropriate ones of the embodiments of the computing device 7000 discussed herein with reference to FIG. 7.

The scientific instrument 8010, the user local computing device 8020, the service local computing device 8030, or the remote computing device 8040 may each include a processing device 7002, a storage device 7004, and an interface device 7006. The processing device 7002 may take any suitable form, including the form of any of the processing devices 7002 discussed herein with reference to FIG. 7, and the processing devices 7002 included in different ones of the scientific instrument 8010, the user local computing device

8020, the service local computing device 8030, or the remote computing device 8040 may take the same form or different forms. The storage device 7004 may take any suitable form, including the form of any of the storage devices 7004 discussed herein with reference to FIG. 7, and the storage devices 7004 included in different ones of the scientific instrument 8010, the user local computing device 8020, the service local computing device 8030, or the remote computing device 8040 may take the same form or different forms. The interface device 7006 may take any suitable form, including the form of any of the interface devices 7006 discussed herein with reference to FIG. 7, and the interface devices 7006 included in different ones of the scientific instrument 8010, the user local computing device 8020, the service local computing device 8030, or the remote computing device 8040 may take the same form or different forms.

The scientific instrument 8010, the user local computing device 8020, the service local computing device 8030, and the remote computing device 8040 may be in communication with other elements of the scientific instrument support system 8000 via communication pathways 8008. The communication pathways 8008 may communicatively couple the interface devices 7006 of different ones of the elements of the scientific instrument support system 8000, as shown, and may be wired or wireless communication pathways (e.g., in accordance with any of the communication techniques discussed herein with reference to the interface devices 7006 of the computing device 7000 of FIG. 7). The particular scientific instrument support system 8000 depicted in FIG. 8 includes communication pathways between each pair of the scientific instrument 8010, the user local computing device 8020, the service local computing device 8030, and the remote computing device 8040, but this "fully connected" implementation is simply illustrative, and in various embodiments, various ones of the communication pathways 8008 may be absent. For example, in some embodiments, a service local computing device 8030 may not have a direct communication pathway 8008 between its interface device 7006 and the interface device 7006 of the scientific instrument 8010, but may instead communicate with the scientific instrument 8010 via the communication pathway 8008 between the service local computing device 8030 and the user local computing device 8020 and the communication pathway 8008 between the user local computing device 8020 and the scientific instrument 8010.

Figure 9:
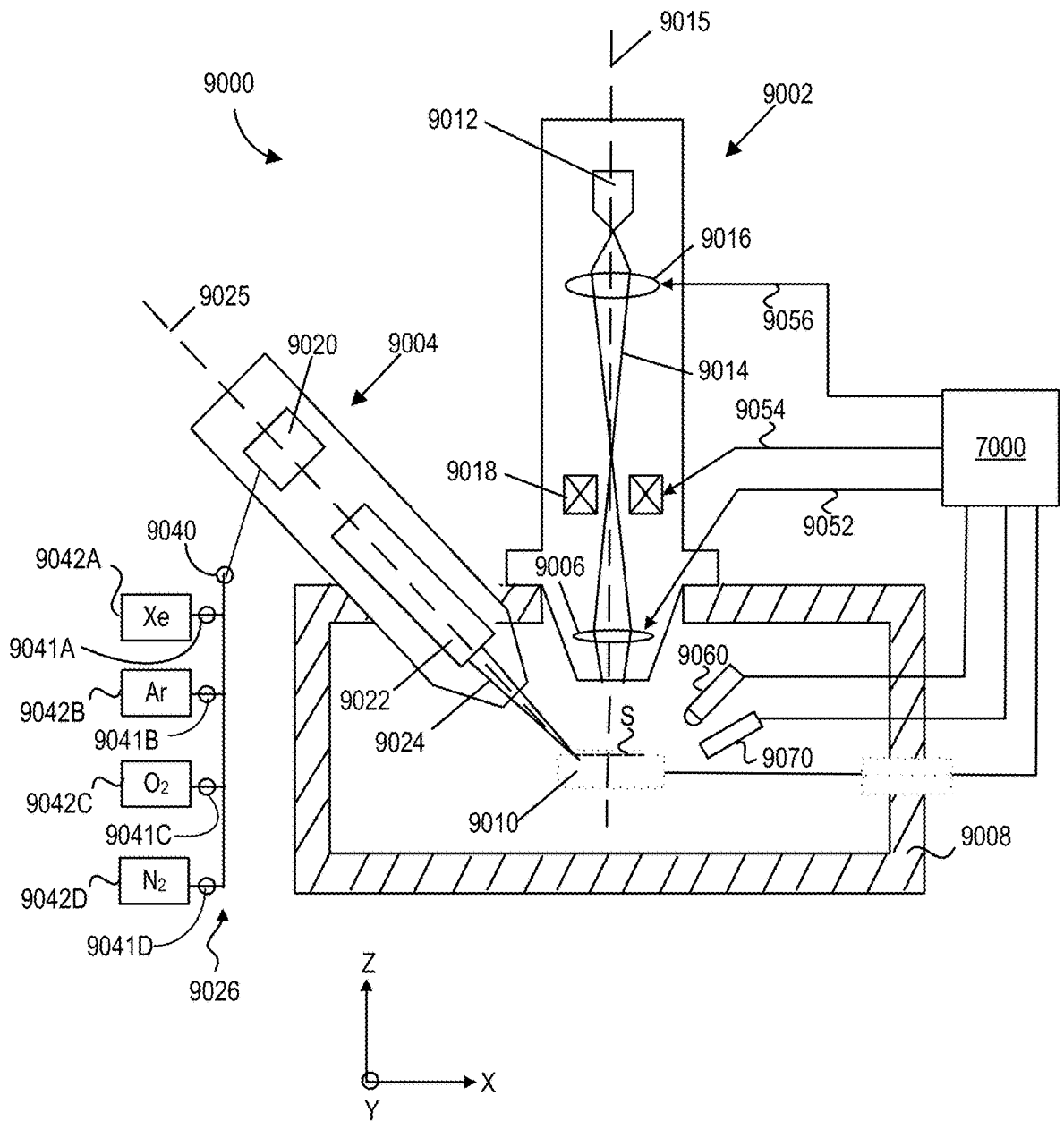
FIG. 9 is a block diagram of an example scientific instrument included in the scientific instrument support system of FIG. 8, in accordance with various embodiments.

The scientific instrument 8010 may comprise any appropriate scientific instrument, such as, for example, a dual-beam instrument. FIG. 9 illustrates the scientific instrument 8010 implemented as a dual-beam instrument 9000 according to some embodiments. The dual-beam instrument 9000 may include an electron-beam instrument, such as, for example, a SEM instrument or column 9002, and an ion-beam instrument, such as, for example, a FIB or PFIB instrument or column 9004, wherein the SEM column 9002 and the FIB column 9004 are both coupled to a vacuum chamber 9008. The vacuum chamber 9008 houses a movable sample holder 9010 and is evacuated using one or more vacuum pumps (not explicitly shown in FIG. 9). In an example embodiment, the holder 9010 is independently movable parallel to the XY-coordinate plane and parallel to the Z-coordinate axis (see coordinate system illustrated in FIG. 9). A sample S to be processed using the dual-beam instrument 9000 may be mounted in holder 9010 as indicated in FIG. 9. As illustrated in FIG. 9, the example embodiment includes a computing device 7000 as generally described above with respect to FIG. 7. The computing device 7000 may be configured to send and receive one or more control signals as described below and, in some embodiments, may perform the support methods described herein. However, as noted above, in other embodiments, the method may be performed remote from the scientific instrument 8010 via one or more external computing devices 7000. Accordingly, the inclusion of the computing device 7000 in the dual-beam instrument 9000 represents one possible embodiment of such a scientific instrument.

The SEM column 9002 may comprise an electron source 9012 and one or more CPB lenses, only two of which (e.g., an objective lens 9006 and a condenser lens 9016) are shown in FIG. 9. In alternative embodiments, the SEM column 9002 may include a different number of CPB lenses. In an example embodiment, the objective lens 9006 comprises an ultra high resolution (UHR) lens (also sometimes referred to as an immersion lens) but other types of CPB lenses may be used. At least one of the CPB lenses of the SEM column 9002 has an adjustable setting that controls a magnetic force applied via the CPB lens (e.g., via varying AT levels).

In some embodiments, the CPB lens of the SEM column 9002, such as, for example, the UHR lens 9006, may be operated in several different operating modes characterized by different (e.g., non-overlapping) MMF ranges. For example, in a first operating mode, the UHR lens 9006 may be configured to operate with a relatively low excitation level, e.g., with the resulting MMFs ranging between about −25 AT and +25 AT. The first operating mode may also be referred to as the "OFF" or "near-zero" mode. In a second operating mode, the UHR lens 9006 may be configured to generate MMFs in the range between about 100 AT and about 300 AT. In a third operating mode, the UHR lens 9006 may be configured to generate MMFs greater than about 500 AT, e.g., equal to or greater than about 1000 AT. The third operating mode may also be referred to as the "imaging" mode, as this mode may be used to perform SEM imaging of sample S.

The SEM column 9002 may also comprise a deflection unit 9018 that steers the electron beam 9014 in response to a control signal 9054. Such beam steering may be used to move a focused portion of the electron beam 9014 along a desired path across the sample S (e.g., to perform a raster or vector scan of the sample S).

In operation, the electron source 9012 produces an electron beam 9014 propagating generally along a longitudinal axis 9015 of the SEM column 9002. The CPB lenses 9006 and 9016 generate electric and magnetic fields that affect the electron trajectories of the electron beam 9014. Control signals 9052, 9056 may be used to change the strengths and/or spatial configurations of the fields generated via the CPB lenses 9006 and 9016 to impart desired properties on the electron beam 9014. In general, the CPB lenses 9006 and 9016, the control signals 9052 and 9056, and other pertinent components of the dual-beam instrument 9000 perform various operations and support various functions, such as beam focusing, aberration mitigation, aperture cropping, filtering, etc., as well as, in some embodiments, the support method 2000 described herein.

The FIB column 9004 may comprise an ion source 9020 and ion-beam optics 9022. In the illustrated embodiment, the ion source 9020 is a plasma source connected to a plurality of gas volumes 9042 by way of a gas manifold 9026. For illustration purposes and without any implied limitations, FIG. 9 illustrates four gas volumes 9042A, 9042B, 9042C, and 9042D. Gas flows through the manifold 9026 are controlled by valves 9040 and 9041A-9041D. More specifically, the valves 9041A-9041D are used to select individual gases stored in volumes 9042A-9042D, respectively, or make mixtures thereof for the ion source 9020. The valve 9040 may be used to control the flow of the selected gas(es) from gas manifold 9026 to the ion source 9020. As an example, FIG. 9 illustrates volumes 9042A-9042D as containing xenon, argon, oxygen, and nitrogen gases, respectively. Other suitable gases may similarly be loaded into some or all of volumes 9042A-9042D. Also, in other embodiments, the gas manifold 9026 may be connected to a different number of gas volumes 9042. Also, in other embodiments, the ion source 9020 may comprise a liquid metal ion source (LMIS) or any other ion source compatible with the FIB column 9004 and with the dual-beam instrument 9000 in general.

In operation, the ion source 9020 ionizes the gas(es) received through the valve 9040 from the gas manifold 9026, thereby forming a plasma. Ions extracted from the plasma are then accelerated through the FIB column 9004 to form an ion beam 9024 propagating generally along a longitudinal axis 9025 of the FIB column 9004. In an example embodiment, the longitudinal axis 9025 is oriented at a non-zero angle (e.g., in a range between approximately 30 degrees and 60 degrees) with respect to the longitudinal axis 9015. In the example embodiment illustrated in FIG. 9, the axis 9015 is a vertical axis, whereas the axis 9025 is a tilted axis. In other embodiments, other spatial arrangements of the columns 9002 and 9004 are also possible.

Ion-beam optics 9022 may be used, among other things, to focus the ion beam 9024 at the sample S and to move a focused portion of the ion beam 9024 along a desired path across the sample S (e.g., to perform a raster or vector scan of the sample S). As indicated above, the ion beam 9024 may be used to perform imaging of the sample S and/or machining operations, such as, for example, incising, milling, etching, depositing, and the like. In an example embodiment, the ion-beam optics 9022 may include one or more CPB lenses (not explicitly shown in FIG. 9).

The dual-beam instrument 9000 may also comprise detectors 9060, 9070 located in the vacuum chamber 9008. The specific types of the detectors 9060, 9070 may depend on the embodiment of the dual-beam instrument 9000 and may be chosen from a variety of detector types suitable for detecting different types of "stimulated" emission and/or radiation from the sample S in response to the electron beam 9014 and/or ion beam 9024. For example, in one possible embodiment, the detector 9060 may be a solid-state detector (e.g., a photodiode) capable of detecting cathodoluminescence emanating from the sample S, and the detector 9070 may be an electron detector capable of detecting backscattered and/or secondary electrons emanating from the sample S.

By scanning the electron beam 9014 or the ion beam 9024 across the surface of the sample S, different portions of the sample may be probed in a controllable and spatially resolved manner. Since the corresponding stimulated emission/radiation is typically position-dependent, the measurement results generated by the detectors 9060, 9070 may be coupled with the scan-path information to produce spatially resolved information. For example, measurement results and scan-path information may be processed to produce images of sample S, other suitable representations of the information, or a combination thereof.

When the plasma source 9020 receives a polyatomic gas from the manifold 9026, the plasma generated therein and the corresponding ion beam 9024 may comprise a mixture of monoatomic, polyatomic, and molecular ion species. For example, in the case of oxygen, the mixture may include O+ and O2+ ions. Similarly, in the case of nitrogen, the mixture may include N+ and N2+ ions. The monoatomic and molecular components of the mixture may have different mass-to-charge ratios. However, according to classical electrodynamics, only particles with the same mass-to-charge ratio will move along the same path in a vacuum when subjected to the same electric and magnetic fields. As a result, and as described above, the ion beam 9024 generated from the O2 or N2 gas may arrive at sample S in the form of two spatially separate and distinct ion sub-beams, the first of the two sub-beams comprising the monoatomic-ion component O+ or N+, and the second of the two sub-beams comprising the molecular-ion component O2+ or N2+. As noted above, the presence of two ion sub-beams instead of one at sample S during image acquisition may cause image artifacts in the images acquired using the dual-beam instrument 9000. Such image artifacts may also appear in other situations causing the ion beam 9024 to have two or more ion species characterized by different respective mass-to-charge ratios. Such situations may arise, for example, when the manifold 9026 contains a significant unflushed amount of a different, previously used gas or when the used monoatomic gas (e.g., Xe) is a mixture of two different isotopes.

These and possibly some other related problems may beneficially be addressed using at least the support method 2000 described above via a computing device 7000 as also described above. As noted above, the dual-beam instrument 9000 may include or communicate with a computing device 7000, such as, for example, the user local computing device 8020, the service local computing device 8030, the remote computing device 8040, or a combination thereof. As described above, the method 2000 provides an automated beam-alignment procedure reduce or minimize misalignment sub-beams of the ion beam 9024 at the sample S such that, for example, the sub-beams arrive at substantially the same (movable) spot on the sample S. The beam-alignment procedure may be aided by automated image processing and analysis implemented in the computing device 7000. Based on such processing and analysis, the configuration(s) of one or more CPB lenses and/or other pertinent components used in the SEM column 9002 may be iteratively and/or dynamically tuned to minimize sub-beam misalignment at the sample S when the FIB column 9004 is used independently of the SEM column 9002.

Returning to FIG. 8, the user local computing device 8020 may be a computing device (e.g., in accordance with any of the embodiments of the computing device 7000 discussed herein) that is local to a user of the scientific instrument 8010. In some embodiments, the user local computing device 8020 may also be local to the scientific instrument 8010, but this need not be the case; for example, a user local computing device 8020 that is in a user's home or office may be remote from, but in communication with, the scientific instrument 8010 so that the user may use the user local computing device 8020 to control and/or access data from the scientific instrument 8010. In some embodiments, the user local computing device 8020 may be a laptop, smartphone, or tablet device. In some embodiments the user local computing device 8020 may be a portable computing device.

The service local computing device 8030 may be a computing device (e.g., in accordance with any of the embodiments of the computing device 7000 discussed herein) that is local to an entity that services the scientific instrument 8010. For example, the service local computing device 8030 may be local to a manufacturer of the scientific instrument 8010 or to a third-party service company. In some embodiments, the service local computing device 8030 may communicate with the scientific instrument 8010, the user local computing device 8020, and/or the remote computing device 8040 (e.g., via a direct communication pathway 8008 or via multiple "indirect" communication pathways 8008, as discussed above) to receive data regarding the operation of the scientific instrument 8010, the user local computing device 8020, and/or the remote computing device 8040 (e.g., the results of self-tests of the scientific instrument 8010, calibration coefficients used by the scientific instrument 8010, the measurements of sensors or detectors associated with the scientific instrument 8010, etc.). In some embodiments, the service local computing device 8030 may communicate with the scientific instrument 8010, the user local computing device 8020, and/or the remote computing device 8040 (e.g., via a direct communication pathway 8008 or via multiple "indirect" communication pathways 8008, as discussed above) to transmit data to the scientific instrument 8010, the user local computing device 8020, and/or the remote computing device 8040 (e.g., to update programmed instructions, such as firmware, in the scientific instrument 8010, to initiate the performance of test or calibration sequences in the scientific instrument 8010, to update programmed instructions, such as software, in the user local computing device 8020 or the remote computing device 8040, etc.). A user of the scientific instrument 8010 may utilize the scientific instrument 8010 or the user local computing device 8020 to communicate with the service local computing device 8030 to report a problem with the scientific instrument 8010 or the user local computing device 8020, to request a visit from a technician to improve the operation of the scientific instrument 8010, to order consumables or replacement parts associated with the scientific instrument 8010, or for other purposes.

The remote computing device 8040 may be a computing device (e.g., in accordance with any of the embodiments of the computing device 7000 discussed herein) that is remote from the scientific instrument 8010 and/or from the user local computing device 8020. In some embodiments, the remote computing device 8040 may be included in a datacenter or other large-scale server environment. In some embodiments, the remote computing device 8040 may include network-attached storage (e.g., as part of the storage device 7004). The remote computing device 8040 may store data generated by the scientific instrument 8010, perform analyses of the data generated by the scientific instrument 8010 (e.g., in accordance with programmed instructions), facilitate communication between the user local computing device 8020 and the scientific instrument 8010, and/or facilitate communication between the service local computing device 8030 and the scientific instrument 8010.

In some embodiments, one or more of the elements of the scientific instrument support system 8000 illustrated in FIG. 8 may not be present. Further, in some embodiments, multiple ones of various ones of the elements of the scientific instrument support system 8000 of FIG. 8 may be present. For example, a scientific instrument support system 8000 may include multiple user local computing devices 8020 (e.g., different user local computing devices 8020 associated with different users or in different locations). In another example, a scientific instrument support system 8000 may include multiple scientific instruments 8010, all in communication with service local computing device 8030 and/or a remote computing device 8040; in such an embodiment, the service local computing device 8030 may monitor these multiple scientific instruments 8010, and the service local computing device 8030 may cause updates or other information may be "broadcast" to multiple scientific instruments 8010 at the same time. Different ones of the scientific instruments 8010 in a scientific instrument support system 8000 may be located close to one another (e.g., in the same room) or farther from one another (e.g., on different floors of a building, in different buildings, in different cities, etc.). In some embodiments, a scientific instrument 8010 may be connected to an Internet-of-Things (IoT) stack that allows for command and control of the scientific instrument 8010 through a web-based application, a virtual or augmented reality application, a mobile application, and/or a desktop application. Any of these applications may be accessed by a user operating the user local computing device 8020 in communication with the scientific instrument 8010 by the intervening remote computing device 8040. In some embodiments, a scientific instrument 8010 may be sold by the manufacturer along with one or more associated user local computing devices 8020 as part of a local scientific instrument computing unit 8012.

According to an example embodiment disclosed above, e.g., in reference to any one or any combination of some or all of FIGS. 1-9, provided is an apparatus comprising: first logic configured to acquire an image by causing an ion-beam instrument of a dual-beam instrument to scan an ion beam across a sample and detect, via one or more detectors of the dual-beam instrument, emission from the sample produced in response to the ion beam being scanned, the ion beam including first and second sub-beams having ions of different respective mass-to-charge ratios, the image acquired with a CPB lens of an electron-beam instrument of the dual-beam instrument operating at a first setting; second logic configured to apply automated image processing to the image to quantify an amount of spatial misalignment of the first and second sub-beams at the sample represented within the image; and third logic configured to compare the quantified amount of spatial misalignment to a threshold and, in response to the quantified amount of spatial misalignment satisfying a threshold, control the dual-beam instrument to set the CPB lens of the electron-beam instrument to a setting based on the first setting of the CPB lens.

In some embodiments of the above apparatus, at least two of the first logic, the second logic, and the third logic are implemented by a common computing device.

In some embodiments of any of the above apparatus, at least one of the first logic, the second logic, and the third logic is implemented by a computing device remote from the dual-beam instrument.

In some embodiments of any of the above apparatus, at least one of the first logic, the second logic, and the third logic is implemented in the dual-beam instrument.

In some embodiments of any of the above apparatus, the electron-beam instrument includes a scanning electron microscope (SEM) instrument and the CPB lens includes an immersion lens.

In some embodiments of any of the above apparatus, the first logic is further configured to confirm whether one or more trigger conditions are satisfied prior to acquiring the image, the one or more trigger conditions representing operating conditions of the dual-beam instrument causing spatial splitting of the first and second sub-beams at the sample.

In some embodiments of any of the above apparatus, in response to the quantified amount of spatial misalignment not satisfying the threshold, the first logic is further configured to acquire one or more additional images by causing the ion-beam instrument of the dual-beam instrument to scan the ion beam across the sample and detect, via the one or more detectors of the dual-beam instrument, emission from the sample produced in response to the ion beam, each of the one or more images acquired with the CPB lens operating in a different setting, the second logic is further configured to apply the automated image processing to each of the one or more additional images to quantify an amount of spatial misalignment of the first and second sub-beams at the sample represented within each additional image, and the third logic is further configured to cause the dual-beam instrument to configure the CPB lens based on the quantified amount of spatial misalignment represented within each additional image.

In some embodiments of any of the above apparatus, the CPB lens is further configured based on a second setting corresponding to a minimum amount of spatial misalignment determined based on the quantified amount of spatial misalignment represented within each additional image.

In some embodiments of any of the above apparatus, the quantified amount of spatial misalignment is based on a degree of displacement between sample images formed by the first sub-beam and the second sub-beam. The degree of displacement may be quantified using displacement between the sample images corresponding to different sub-beams; the area, shape, and other suitable attributes of the FFT of the image; and/or the degree of blurriness quantified by application of a suitable image-processing method.

In some embodiments of any of the above apparatus, the automated image processing comprises applying a Fourier-transform operation to the image.

In some embodiments of any of the above apparatus, the automated image processing further comprises generating a binary Fourier-transform map for the image by applying a thresholding operation to a result of the Fourier-transform operation applied to the image.

In some embodiments of any of the above apparatus, the second logic is configured to quantify an amount of spatial misalignment of the first and second sub-beams represented within the image based on at least one of an area, perimeter, and roundness of shapes representing the first and second sub-beams within the binary Fourier-transform map generated for the image.

In some embodiments of any of the above apparatus, the support apparatus is configured to determine the setting of the CPB lens of the electron-beam instrument based on a look-up table.

According to another example embodiment disclosed above, e.g., in reference to any one or any combination of some or all of FIGS. 1-9, provided is an automated method performed via a computing device for providing scientific instrument support, the method comprising the steps of: acquiring one or more images by causing an ion-beam instrument of a dual-beam instrument to scan an ion beam across a sample and detecting, via one or more detectors of the dual-beam instrument, emission from the sample produced in response to the ion beam, the ion beam including first and second sub-beams having ions of different respective mass-to-charge ratios, each of the one or more images being acquired with a CPB lens of an electron-beam instrument of the dual-beam instrument operating in a respective setting; applying automated image processing to the one or more images to quantify an amount of spatial misalignment of the first and second sub-beams at the sample represented within each of the one or more images and selecting at least one image of the plurality of images based on the quantified amount of spatial misalignment presented with each of the one or more images; and controlling the dual-beam instrument to set the CPB lens of the electron-beam instrument to a setting based on the respective setting of the CPB lens associated with the selected at least one image of the one or more images.

In some embodiments of the above method, applying the automated image processing comprises applying a Fourier-transform operation to each of the one or more images.

In some embodiments of any of the above methods, applying the automated image processing comprises generating a binary Fourier-transform map for each of the one or more images by applying a thresholding operation to a result of the Fourier-transform operation applied to each of the one or more images.

In some embodiments of any of the above methods, applying the automated image processing further comprises quantifying the amount of spatial misalignment of the first and second sub-beams represented within the image based on at least one of an area, perimeter, and roundness of shapes corresponding to the first and second sub-beams within the binary Fourier-transform map generated for the image.

According to yet another example embodiment disclosed above, e.g., in reference to any one or any combination of some or all of FIGS. 1-9, provided are one or more non-transitory computer readable media having instructions thereon that, when executed by one or more processing devices of a support apparatus for the dual-beam instrument, cause the support apparatus to perform an automated method comprising the steps of: acquiring one or more images by causing an ion-beam instrument of a dual-beam instrument to scan an ion beam across a sample and detecting, via one or more detectors of the dual-beam instrument, emission from the sample produced in response to the ion beam, the ion beam including first and second sub-beams having ions of different respective mass-to-charge ratios, each of the one or more images being acquired with a CPB lens of an electron-beam instrument of the dual-beam instrument operating in a respective setting; applying automated image processing to the one or more images to quantify an amount of spatial misalignment of the first and second sub-beams at the sample represented within each of the one or more images and selecting at least one image of the plurality of images based on the quantified amount of spatial misalignment presented with each of the one or more images; and controlling the dual-beam instrument to set the CPB lens of the electron-beam instrument to a setting based on the respective setting of the CPB lens associated with the selected at least one image of the one or more images.

According to yet another example embodiment disclosed above, e.g., in reference to any one or any combination of some or all of FIGS. 1-9, provided is a scientific instrument, comprising: an ion-beam instrument configured to generate an ion beam, the ion beam including first and second sub-beams having ions of different respective mass-to-charge ratios; an electron-beam instrument including a CPB lens having an adjustable setting controlling a magnetic force applied to the first and second sub-beams; and a computing device configured to: acquire one or more images by causing the ion-beam instrument to scan the ion beam across a sample, each of the one or more images corresponding to a respective setting of the CPB lens of the electron-beam instrument, apply automated image processing to the one or more images to quantify an amount of spatial misalignment of the first and second sub-beams at the sample represented within each of the one or more images and selecting at least one image of the one or more images based on the quantified amount of spatial misalignment presented with each of the one or more images, and control the CPB lens of the electron-beam instrument to a setting based on the amount of spatial misalignment within each of the one or more images.

In some embodiments of the above scientific instrument, the computing device is further configured to operate the ion-beam instrument to scan the sample with the CPB lens of the electron-beam instrument being at the setting.

What is claimed is:

1. A support apparatus for a scientific instrument, the support apparatus comprising:
   first logic configured to acquire an image by causing an ion-beam instrument of a dual-beam instrument to scan an ion beam across a sample and detect, via one or more detectors of the dual-beam instrument, emission from the sample produced in response to the scan of the ion beam, the ion beam including first and second sub-beams having ions of different respective mass-to-charge ratios, the image acquired with a charged-particle-beam (CPB) lens of an electron-beam instrument of the dual-beam instrument operating at a first setting;
   second logic configured to apply automated image processing to the image to quantify an amount of spatial misalignment of the first and second sub-beams at the sample represented within the image; and
   third logic configured to compare the quantified amount of spatial misalignment to a threshold and, in response to the quantified amount of spatial misalignment satisfying a threshold, control the dual-beam instrument to set the CPB lens of the electron-beam instrument to a setting based on the first setting of the CPB lens.

2. The support apparatus of claim 1, wherein at least two of the first logic, the second logic, and the third logic are implemented by a common computing device.

3. The support apparatus of claim 1, wherein at least one of the first logic, the second logic, and the third logic is implemented by a computing device remote from the dual-beam instrument.

4. The support apparatus of claim 1, wherein at least one of the first logic, the second logic, and the third logic is implemented in the dual-beam instrument.

5. The support apparatus of claim 1, wherein the electron-beam instrument includes a scanning electron microscope (SEM) instrument and the CPB lens includes an immersion lens.

6. The support apparatus of claim 1, wherein the first logic is further configured to confirm whether one or more trigger conditions are satisfied prior to acquiring the image, the one or more trigger conditions representing operating conditions of the dual-beam instrument causing spatial splitting of the first and second sub-beams at the sample.

7. The support apparatus of claim 1, wherein, in response to the quantified amount of spatial misalignment not satisfying the threshold, the first logic is further configured to acquire one or more additional images by causing the ion-beam instrument of the dual-beam instrument to scan the ion beam across the sample and detect, via the one or more detectors of the dual-beam instrument, emission from the sample produced in response to the ion beam, each of the one or more images acquired with the CPB lens operating in a different setting, the second logic is further configured to apply the automated image processing to each of the one or more additional images to quantify an amount of spatial misalignment of the first and second sub-beams at the sample represented within each additional image, and the third logic is further configured to cause the dual-beam instrument to configure the CPB lens based on the quantified amount of spatial misalignment represented within each additional image.

8. The support apparatus of claim 7, wherein the CPB lens is further configured based on a second setting corresponding to a minimum amount of spatial misalignment determined based on the quantified amount of spatial misalignment represented within each additional image.

9. The support apparatus of claim 1, wherein the quantified amount of spatial misalignment is based on a degree of displacement between sample images formed by the first sub-beam and the second sub-beam.

10. The support apparatus of claim 1, wherein the automated image processing comprises applying a Fourier-transform operation to the image.

11. The support apparatus of claim 10, wherein the automated image processing further comprises generating a binary Fourier-transform map for the image by applying a thresholding operation to a result of the Fourier-transform operation applied to the image.

12. The support apparatus of claim 11, wherein the second logic is configured to quantify an amount of spatial misalignment of the first and second sub-beams represented within the image based on at least one of an area, perimeter, and roundness of shapes representing the first and second sub-beams within the binary Fourier-transform map generated for the image.

13. The support apparatus of claim 1, wherein the support apparatus is configured to determine the setting of the CPB lens of the electron-beam instrument based on a look-up table.

14. An automated method performed via a computing device for providing scientific instrument support, the method comprising:
   acquiring one or more images by causing an ion-beam instrument of a dual-beam instrument to scan an ion beam across a sample and detecting, via one or more detectors of the dual-beam instrument, emission from the sample produced in response to the scan of the ion beam, the ion beam including first and second sub-beams having ions of different respective mass-to-charge ratios, each of the one or more images being acquired with a charged-particle-beam (CPB) lens of an electron-beam instrument of the dual-beam instrument operating in a respective setting;
   applying automated image processing to the one or more images to quantify an amount of spatial misalignment of the first and second sub-beams at the sample represented within each of the one or more images and selecting at least one image of the plurality of images based on the quantified amount of spatial misalignment presented with each of the one or more images; and
   controlling the dual-beam instrument to set the CPB lens of the electron-beam instrument to a setting based on the respective setting of the CPB lens associated with the selected at least one image of the one or more images.

15. The automated method of claim 14, wherein applying the automated image processing comprises applying a Fourier-transform operation to each of the one or more images.

16. The automated method of claim 15, wherein applying the automated image processing further comprises generating a binary Fourier-transform map for each of the one or more images by applying a thresholding operation to a result of the Fourier-transform operation applied to each of the one or more images.

17. The automated method of claim 16, wherein applying the automated image processing further comprises quantifying the amount of spatial misalignment of the first and second sub-beams represented within the image based on at least one of an area, perimeter, and roundness of shapes corresponding to the first and second sub-beams within the binary Fourier-transform map generated for the image.

18. One or more non-transitory computer readable media having instructions thereon that, when executed by one or more processing devices of a support apparatus for the dual-beam instrument, cause the support apparatus to perform the automated method of claim 14.

19. A scientific instrument, comprising:
an ion-beam instrument configured to generate an ion beam, the ion beam including first and second sub-beams having ions of different respective mass-to-charge ratios;
an electron-beam instrument including a charged-particle-beam (CPB) lens having an adjustable setting controlling a magnetic force applied to the first and second sub-beams; and
a computing device configured to:
acquire one or more images by causing the ion-beam instrument to scan the ion beam across a sample, each of the one or more images corresponding to a respective setting of the CPB lens of the electron-beam instrument,
apply automated image processing to the one or more images to quantify an amount of spatial misalignment of the first and second sub-beams at the sample represented within each of the one or more images and selecting at least one image of the one or more images based on the quantified amount of spatial misalignment presented with each of the one or more images, and
control the CPB lens of the electron-beam instrument to a setting based on the amount of spatial misalignment within each of the one or more images.

20. The scientific instrument of claim 19, wherein the computing device is further configured to operate the ion-beam instrument to scan the sample with the CPB lens of the electron-beam instrument being at the setting.

* * * * *